United States Patent
Ono et al.

(10) Patent No.: US 11,248,970 B2
(45) Date of Patent: *Feb. 15, 2022

(54) FORCE-SENSE PRESENTING APPARATUS

(71) Applicant: Sony Corporation, Tokyo (JP)

(72) Inventors: Akira Ono, Kanagawa (JP); Mikio Takenaka, Kanagawa (JP); Shunki Shibaoka, Kanagawa (JP); Masaki Kawata, Tokyo (JP); Hideaki Hayashi, Aichi (JP); Akihiro Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 16/676,894

(22) Filed: Nov. 7, 2019

(65) Prior Publication Data

US 2020/0088591 A1    Mar. 19, 2020

Related U.S. Application Data

(63) Continuation of application No. 15/560,231, filed as application No. PCT/JP2015/005675 on Nov. 13, 2015, now Pat. No. 10,502,644.

(30) Foreign Application Priority Data

Mar. 31, 2015   (JP) .............................. JP2015-072318

(51) Int. Cl.
G01L 1/16 (2006.01)
B06B 1/06 (2006.01)
(Continued)

(52) U.S. Cl.
CPC ................. *G01L 1/16* (2013.01); *B06B 1/06* (2013.01); *G06F 3/016* (2013.01); *H01L 41/09* (2013.01); *H02N 2/026* (2013.01)

(58) Field of Classification Search
CPC .................................. G01L 1/16; H02N 2/026
See application file for complete search history.

(56) References Cited

U.S. PATENT DOCUMENTS 10,502,644 B2    12/2019  Ono et al.
2008/0038125 A1*  2/2008  Onishi ................. F04B 43/023
                                                      417/413.2
(Continued)

FOREIGN PATENT DOCUMENTS

CN    104115102 A    10/2014
JP    2006-119849 A   5/2006
(Continued)

OTHER PUBLICATIONS

Translation of JP-2008287402-A Yamamoto (Year: 2008).*
(Continued)

*Primary Examiner* — Nathaniel T Woodward
(74) *Attorney, Agent, or Firm* — Wolf, Greenfield & Sacks, P.C.

(57) ABSTRACT

[Solving Means] A force-sense presenting apparatus includes a casing structure, a weight, and a drive unit. The weight is provided in the casing structure or incorporated in the casing structure. The drive unit includes a first supporting portion constituted of a pair of supporting structures that support a first side of the weight and a second side opposed to the first side, at least one of the pair of supporting structures being configured to include an actuator capable of providing the weight with biased acceleration.

12 Claims, 19 Drawing Sheets

(51) Int. Cl.
*H01L 41/09* (2006.01)
*G06F 3/01* (2006.01)
*H02N 2/02* (2006.01)

(56) References Cited

U.S. PATENT DOCUMENTS

| | | | |
|---|---|---|---|
| 2008/0122315 A1* | 5/2008 | Maruyama | H01L 41/053 310/314 |
| 2010/0101480 A1 | 4/2010 | Sugahara | |
| 2011/0032091 A1 | 2/2011 | Park et al. | |
| 2014/0028573 A1 | 1/2014 | Olien et al. | |
| 2018/0188121 A1 | 7/2018 | Ono et al. | |

FOREIGN PATENT DOCUMENTS

| | | | | |
|---|---|---|---|---|
| JP | 2008-287402 A | | 11/2008 | |
| JP | 2008287402 A | * | 11/2008 | G06F 3/016 |
| JP | 2010-102613 A | | 5/2010 | |
| JP | 2011-040027 A | | 2/2011 | |
| JP | 4692605 A | | 3/2011 | |
| JP | 2011-071488 A | | 4/2011 | |
| JP | 2011-183374 A | | 9/2011 | |

OTHER PUBLICATIONS

U.S. Appl. No. 15/560,231, filed Sep. 21, 2017, Ono et al.
International Search Report and Written Opinion and English translation thereof dated Jan. 26, 2016 in connection with International Application No. PCT/JP2015/005675.
International Preliminary Report on Patentability and English translation thereof dated Oct. 12, 2017 in connection with International Application No. PCT/JP2015/005675.
Chinese Office Action dated Jun. 9, 2020 in connection with Chinese Application No. 201580078192.0, and English translation thereof.

* cited by examiner

| Shim thickness | 0.2mm | | |
|---|---|---|---|
| Tilt length mm | 0 | 0.5 | 1 |
| Angle $\theta$ ° | 90 | 54 | 40 |
| Natural frequency Hz | 694 | 690 | 680 |

FORCE-SENSE PRESENTING APPARATUS

CROSS REFERENCE TO RELATED APPLICATIONS

The present application claims the benefit under 35 U.S.C. § 120 as a continuation application of U.S. application Ser. No. 15/560,231, filed on Sep. 21, 2017, now U.S. Pat. No. 10,502,644, issued Dec. 10, 2019, which claims the benefit under 35 U.S.C. § 371 as a U.S. National Stage Entry of International Application No. PCT/JP2015/005675, filed in the Japanese Patent Office as a Receiving Office on Nov. 13, 2015, which claims priority to Japanese Patent Application Number JP2015-072318, filed in the Japanese Patent Office on Mar. 31, 2015, each of which is hereby incorporated by reference in its entirety.

TECHNICAL FIELD

The present technology relates to a force-sense presenting apparatus that presents a force-sense in a particular direction to a user.

BACKGROUND ART

A portable apparatus described in Patent Literature 1 includes a force-sense generating apparatus that linearly moves two weights through two ball screw structures. This apparatus causes the two weights to undergo translational motion in the same direction. In this manner, the apparatus is capable of providing a user with a force-sense generated in a direction of counteraction of that translational motion.

CITATION LIST

Patent Literature

Patent Literature 1: Japanese Patent No. 4692605

DISCLOSURE OF INVENTION

Technical Problem

However, in the apparatus of Patent Literature 1, it is necessary to provide two ball screw structures in both sides of an apparatus casing and synchronous control for translationally moving the two weights through them is required. Thus, a large control load is imposed.

It is an object of the present technology to provide a force-sense presenting apparatus including a new structure without the need for the large control load, for example, the synchronous control.

Solution to Problem

In order to accomplish the above-mentioned object, a force-sense presenting apparatus according to the present technology includes a casing structure, a weight, and a drive unit.

The weight is provided in the casing structure or incorporated in the casing structure.

The drive unit includes a first supporting portion constituted of a pair of supporting structures that support a first side of the weight and a second side opposed to the first side, at least one of the pair of supporting structures being configured to include an actuator capable of providing the weight with biased acceleration.

That is, even if actuators are connected to both sides of the first side and the second side, the two actuators and the weight are mechanically connected and integral. Therefore, a large control load, for example, synchronous control is unnecessary.

The actuator may be configured to generate first biased acceleration in a direction from the first side to the second side of the weight or a direction from the second side to the first side.

Accordingly, a driving direction of the weight by the drive unit is determined and a presentation direction of a force-sense is determined.

If one of the pair of supporting structures is the actuator, another of the pair of supporting structures may include a passive drive unit configured to be driven in an axis direction including the direction of the first biased acceleration.

Accordingly, in the axis direction including the direction of the biased acceleration, an operation loss of the weight can be reduced and the weight can be greatly displaced.

The passive drive unit may have a slide structure, a linear motion guide structure, a ball bush structure, a self-lubricating bearing structure, or an anisotropic elastic modulus material.

The force-sense presenting apparatus may further include a second supporting portion constituted of a pair of supporting structures respectively provided on a third side different from the first side and the second side of the weight and on a fourth side opposed thereto.

The pair of supporting structures that constitute the second supporting portion may each include a slide structure that slides in an axis direction including the direction of the first biased acceleration.

At least one of the pair of supporting structures that constitute the second supporting portion may be configured to include an actuator capable of providing second biased acceleration in a direction from the third side to the fourth side of the weight or a direction from the fourth side to the third side.

The pair of supporting structures that constitute the first supporting portion may each include a slide structure that slides in an axis direction including the direction of the second biased acceleration.

Accordingly, even if the weight is movable along two axes (multiple axes), connection of the first supporting portion and the weight does not obstruct weight's motion through the actuator provided in the second supporting portion. Thus, the operation loss can be reduced.

The slide structure may be a linear motion guide structure, a ball bush structure, a self-lubricating bearing structure, or an anisotropic elastic modulus material.

In particular, the use of the anisotropic elastic modulus material greatly contributes to the reduction in size of the force-sense presenting apparatus.

Both of the pair of supporting structures that constitute the first supporting portion may each include the actuator.

Due to the provision of the actuators on the both sides of the first side and the second side of the weight, large driving force can be generated. Further, as described above, the synchronous control is unnecessary.

Both of the pair of supporting structures that constitute the second supporting portion may each include the actuator.

Due to the provision of the actuators on the both sides of the third side and the fourth side of the weight, large driving force can be generated. Further, as described above, the synchronous control is unnecessary.

The weight may be a component constituting a part of the casing structure or a component incorporated in the casing structure.

The component is used as the weight. Therefore, it is unnecessary to use an additional weight. Therefore, a reduction in size of a portable terminal apparatus that is the force-sense presenting apparatus can be achieved.

The force-sense presenting apparatus may be a portable terminal apparatus, and the component may be a battery, a control board, a display panel, or a touch panel.

The actuator may include a piezoelectric element and a shim.

The shim may include a fixation portion fixed to the casing structure, an attachment portion to which the piezoelectric element is attached, and a bend portion provided between the fixation portion and the attachment portion.

The fixation portion and the attachment portion is integrated by the shim including the bend portion, and hence the number of components of the actuator can be reduced. Further, the actuator can be reduced in height and size and the reduction in size of the force-sense presenting apparatus can be realized.

The actuator may be configured to vibrate with a displacement smaller than a difference in height between the fixation portion and the attachment portion, the difference in height being formed by the bend portion.

The bend portion may be provided between the attachment portion and the fixation portion by bending the shim at at least two positions thereof.

Accordingly, it is possible to cause the shim to include the fixation portion, the attachment portion, and the bend portion with a simple structure.

The bend portion has a portion between the attachment portion and the fixation portion, the portion being formed in a straight line shape, a curve shape, or a bellows shape.

The fixation portion may be fixed to the casing structure by welding, adhesion with an adhesive, mechanical engagement, or embedding.

Accordingly, with a simple structure, the fixation portion is fixed to the casing structure, which contributes to the reduction in size of the actuator and the force-sense presenting apparatus.

The attachment portion of the shim may include two or more attachment portions, and the fixation portion of the shim may be common between the two attachment portions.

Accordingly, the actuator thereof can be reduced in size in an array direction of the piezoelectric elements.

The shim may include an aperture.

Accordingly, during manufacture of the actuator, the weight and/or rigidity of the shim can be adjusted and the amount of displacement and the elastic force can be adjusted.

Advantageous Effects of Invention

Hereinabove, in accordance with the present technology, it is possible to provide a force-sense presenting apparatus that does not need a large control load of synchronous control and the like.

It should be noted that the effect described here is not necessarily limitative and may be any effect described in the present disclosure.

MODE(S) FOR CARRYING OUT THE INVENTION

Hereinafter, embodiments according to the present technology will be described with reference to the drawings.

1. Force-Sense Presenting Apparatus According to Embodiment

1.1) Configuration of Force-Sense Presenting Apparatus

Figure 1:
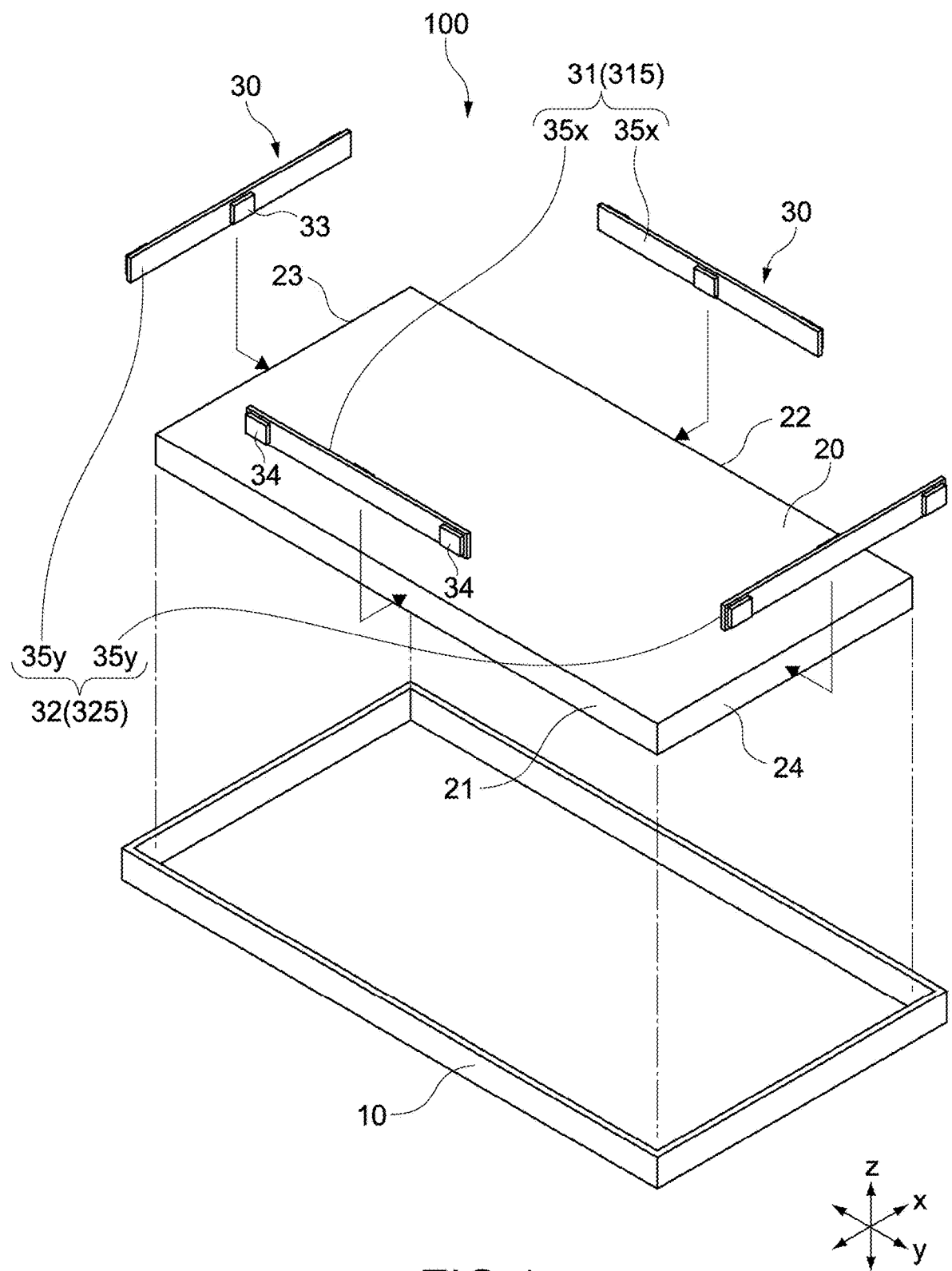
FIG. 1 is an exploded perspective view showing a force-sense presenting apparatus according to a first embodiment of the present technology.
Figure 2:
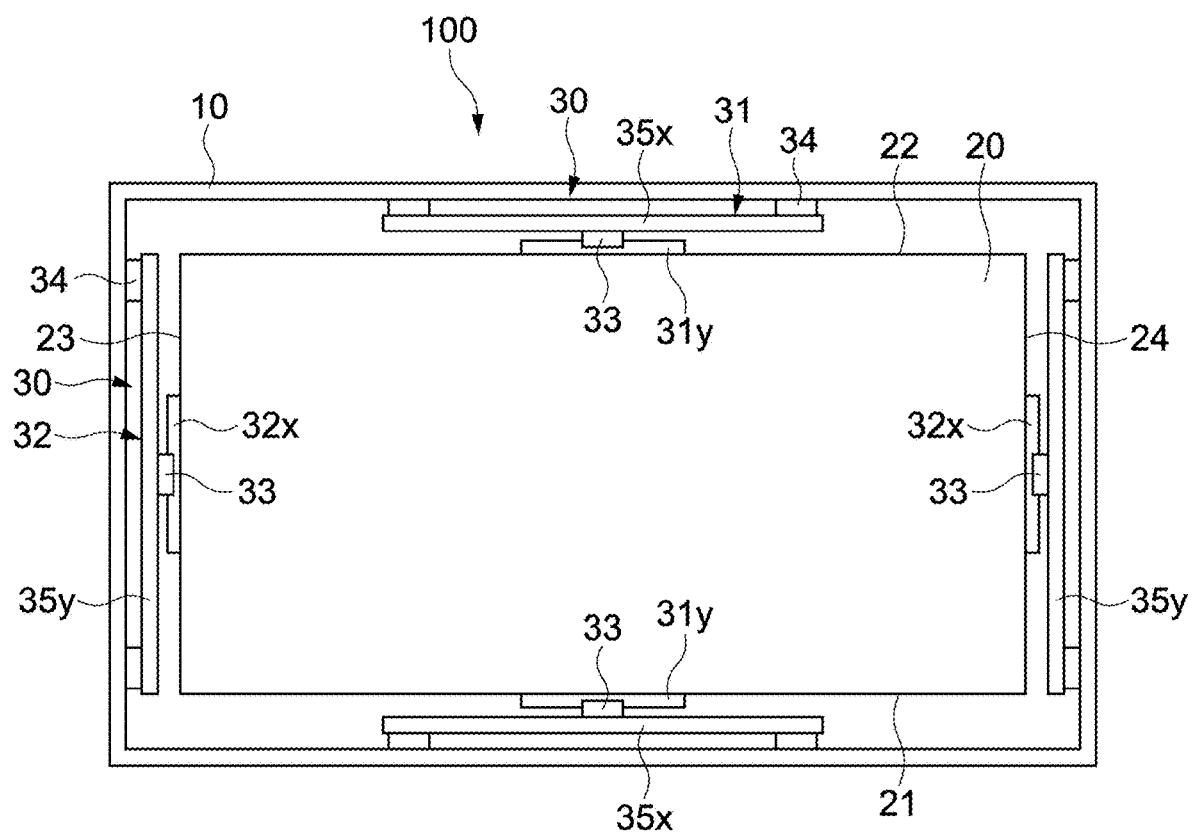
FIG. 2 is a plan view of the force-sense presenting apparatus shown in FIG. 1.

FIG. 1 is an exploded perspective view showing a force-sense presenting apparatus according to an embodiment of the present technology. FIG. 2 is a plan view of a force-sense presenting apparatus 100 shown in FIG. 1. The force-sense presenting apparatus 100 includes a casing structure 10, a weight 20 (inertial load) incorporated in the casing structure 10, and drive units 30 capable of supporting and driving the weight 20 within the casing structure 10.

The casing structure 10 is formed of a rectangle, for example. The casing structure 10 is constituted of an outer casing itself or is formed by integrally attaching a chassis or a frame to the outer casing. The weight 20 is typically formed in a rectangular plate shape adapted for the casing structure 10. However, the weight 20 can have any shape.

The drive unit 30 include a first supporting portion 31 and a second supporting portion 32 that support the weight 20. The first supporting portion 31 includes a pair of supporting structures 31s respectively connected to a first side 21 of the weight 20 and a second side 22 opposed thereto in an x-axis direction. The second supporting portion 32 includes a pair of supporting structures 32s respectively connected to a third side 23 of the weight 20 and a fourth side 24 opposed thereto in a y-axis direction.

The pair of supporting structures 31s of the first supporting portion 31 respectively include X-actuators 35x, for example. The pair of supporting structures 32s of the second supporting portion 32 also respectively include Y-actuators 35y. For example, piezoelectric actuators are used as these actuators and all have the same basic configurations. The X-actuators 35x and the Y-actuators 35y may have different sizes. For the sake of description, any one of the X-actuators 35x and the Y-actuators 35y will be simply referred to as an "actuator 35".

Figure 3:
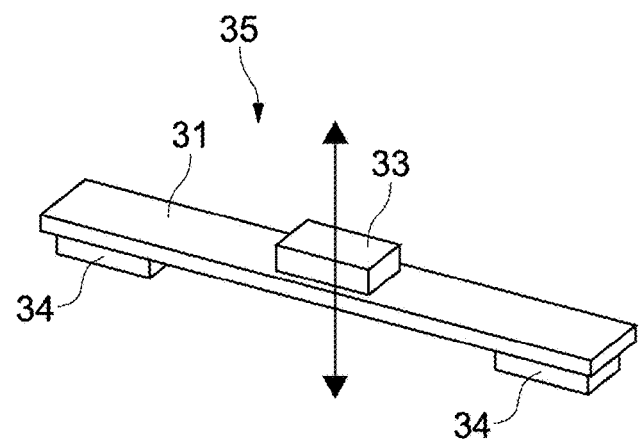
FIG. 3 is a perspective view showing an example of a configuration of an actuator.

FIG. 3 is a perspective view showing an example of a configuration of the actuator 35. The actuator 35 includes, for example, a plate-like piezoelectric element 31 and connection portions 33 and 34 to which this piezoelectric element 31 is connected. The connection portions 34 are provided at both end portions of the piezoelectric element 31, for example, and fixed to the casing structure 10 (see A of FIG. 1). The connection portion 33 is provided at a center portion of the piezoelectric element 31, for example, and connected to the weight 20 via a slide structure to be described later. Although not shown in the figure, the piezoelectric element 31 is provided with an input terminal for electrical signals. Driving signals are input therein. Accordingly, the actuator 35 is capable of vibrating in upper and lower directions in FIG. 3 with the connection portions 34 and 34 being the ends and the connection portion 33 being the middle. That is, referring to FIG. 2, the weight 20 is capable of vibrating in any direction along two axes of x- and y-axes, i.e., in an x-y plane at any amplitude and acceleration.

Note that, as will be described later, the actuator 35 may include the piezoelectric element 31 and a shim (not shown). In this case, the actuator 35 may have a unimorph structure formed by providing one piezoelectric element on one surface of the shim or may have a bimorph structure formed by providing two piezoelectric elements on both surfaces of the shim.

Note that the above-mentioned configuration of the actuator 35 is merely an example and devices having various shapes, sizes, and structures using the piezoelectric element 31 are applicable.

The use of the piezoelectric device as the actuator 35 in the above-mentioned manner can enhance the response speed of the actuator in comparison with, for example, a device using an eccentric motor, a linear motor, or the like. The response speed of 5 ms or less can be realized as the response speed of the piezoelectric device.

The pair of supporting structures 31s of the first supporting portion 31 (see FIG. 1) each include a Y-slide structure 31y as shown in FIG. 2. The pair of supporting structures 32s of the second supporting portion 32 each include an X-slide structure 32x. The illustrations of these slide structures are omitted from FIG. 1.

The Y-slide structures 31y each include a guide portion provided along a y-axis in an extended manner, for sliding relative to the connection portion 33 of the X-actuator 35x. The X-slide structure 32x includes a guide portion provided along an x-axis in an extended manner, for sliding relative to the connection portion 33 of the Y-actuator 35y. These guide portions are respectively fixed to the first side 21, the second side 22, the third side 23, and the fourth side 24 of the weight 20.

A well-known structure, for example, a linear motion guide structure, a ball bush structure, or a self-lubricating bearing structure is applicable as the slide structure.

1.2) Driving Operation by Drive Units

1.2.1) Regarding Biased Acceleration

In the force-sense presenting apparatus 100 according to this embodiment, the weight 20 vibrates along with translational motion in an x-direction due to driving of the X-actuators 35x. Further, the weight 20 vibrates along with translational motion in a y-direction due to driving of the Y-actuators 35y.

In general, intended force-senses are not generated during constant vibration motion whose amplitude and frequency are made identical. Exemplifying an eccentric motor that is a rotor, centripetal force ($\Delta m r \omega^2$), which is obtained by multiplication of an eccentric load ($\Delta m$) and centripetal acceleration ($r\omega^2$), constantly changes the direction over time and can be detected as vibrations. However, it is not force-sense presentation having directivity.

In translational motion of an inertial load (m), a difference (a1−a2) is set between acceleration (a1) in a forward path and acceleration (a2) in a backward path. Then, vibration thereof is continuously made. In this manner, force (m(a1−a2)) constantly having directivity, that is, force caused by biased acceleration is generated. It is considered that it can be detected as the force-sense.

If the acceleration is integrated over a certain time, the resulting value becomes zero. Thus, in reality, no force is generated. Therefore, it is estimated that perceptible force is some kind of illusion caused by a human perception mechanism. Regarding a generation principle of a virtual force-sense, there is one depending on a relationship between stimulus and intensity of sense associated with it, which is called Stevens's power law. It is estimated that an integrated value of measured acceleration is zero while an integrated value of a perceived sense is not zero and it is perceptible as force. Another factor is a masking effect of stimulus. It is a phenomenon that a weak stimulus given directly after a strong stimulus is masked (hardly perceived). It is considered that force-senses can be detected by these human perception mechanisms.

As described above, biased acceleration can be generated by setting a difference between acceleration of vibrations in the forward path and acceleration in the backward path. The present technology applies this generation principle of biased acceleration to the force-sense presenting apparatus 100. For example, in a case of presenting a force-sense in the +(or −) direction on the x-axis, the force-sense presenting apparatus 100 generates biased acceleration (first biased acceleration) in the +(or −) direction on the x-axis through the X-actuators 35x. Further, in a case of presenting a force-sense in the +(or −) direction on the y-axis, the force-sense presenting apparatus 100 generates biased acceleration (second biased acceleration) in the +(or −) direction on the y-axis through the Y-actuators 35y.

In addition, the force-sense presenting apparatus 100 is capable of driving the X-actuators 35x and the Y-actuators 35y at the same time to thereby generate composite biased acceleration of the x- and y-axes and presenting a force-sense in that composite direction.

Figure 4:
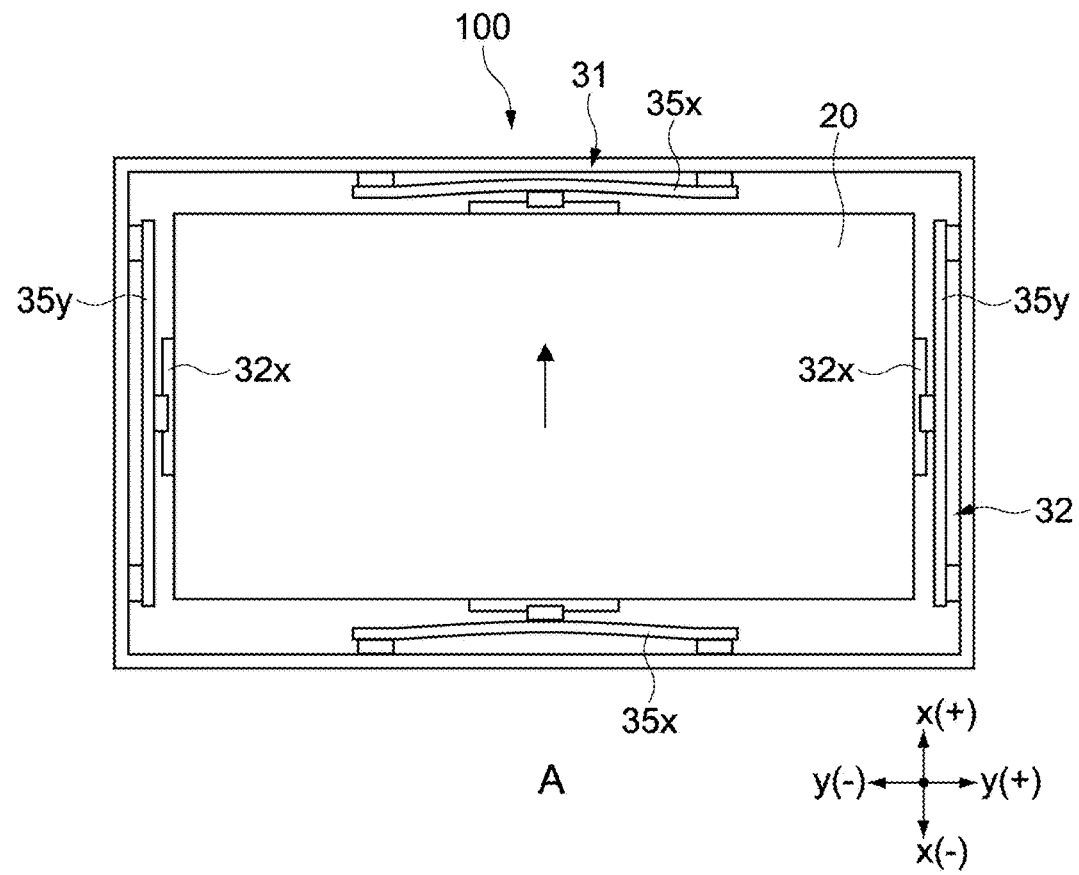
FIGS. 4 A and B of FIG. 4 are diagrams showing a particular point of time in a case where the weight vibrates.
Figure 4:
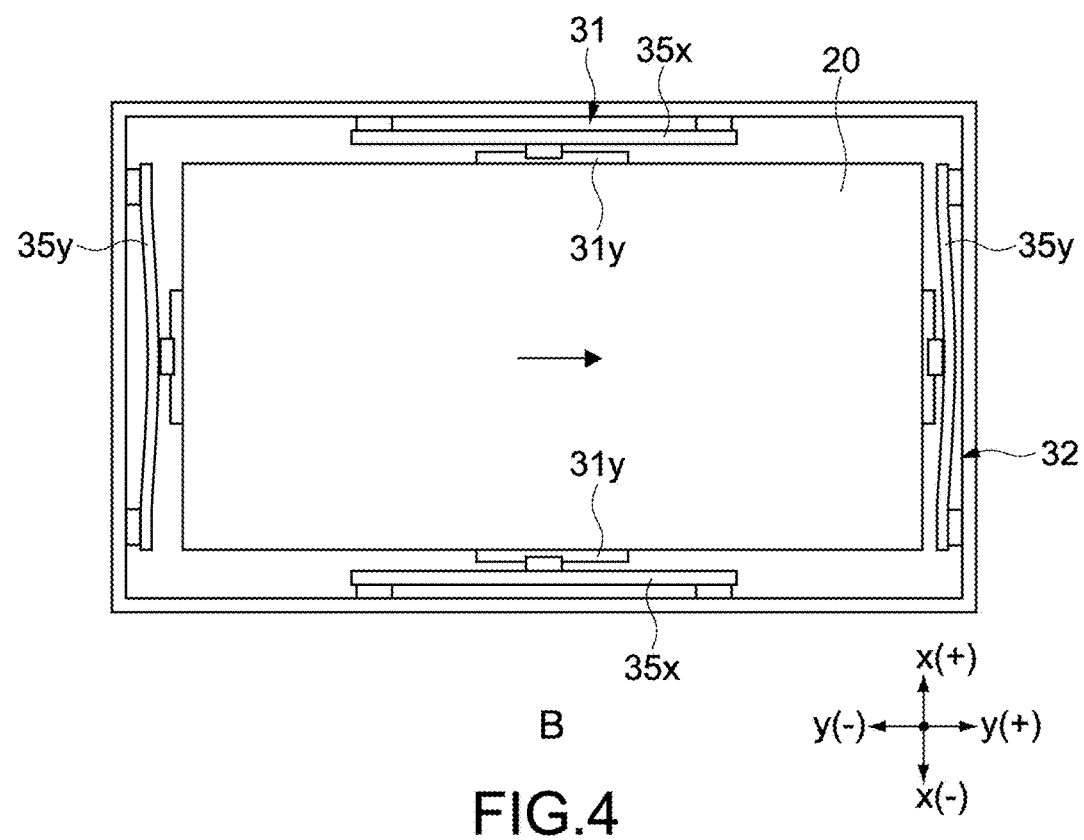

1.2.2) Operations of Respective Supporting Structures upon Driving by Drive Units A and B of FIG. 4 are diagrams showing a particular point of time in a case where the weight 20 vibrates.

As shown in A of FIG. 4, the X-actuators 35x is driven to move the weight 20 along the x-axis (for example, in upper direction in figure). In this way, in the second supporting portion 32, the weight 20 can smoothly move in the x-axis direction due to slide motion of the X-slide structure 32x. Alternatively, as shown in B of FIG. 4, the Y-actuators 35y is driven to move the weight 20 along the y-axis (for example, right direction in figure). In this way, in the first supporting portion 31, the weight 20 can smoothly move in the y-axis direction due to slide motion of the X-slide structure 32x. In this manner, in this embodiment, it is possible to reduce the driving loss in comparison with a case where no slide structure is provided.

In this embodiment, the motion of the two X-actuators 35x is the same. Further, the motion of the two Y-actuators 35y is the same. The phrases "the motion is the same" means that those two actuators move at substantially the same amplitude in substantially the same direction.

As described above, during vibration in the x-axis direction, if the acceleration of the weight 20 in a movement path in an x-axis(+) direction is larger than acceleration in a movement path in an x-axis(−) direction, biased acceleration is generated in the x-axis(+) direction. Accordingly, a force-sense is presented in that x-axis(+) direction. Further, during vibration in the y-axis direction, if acceleration of the weight 20 in a movement path in a y-axis(+) direction is larger than acceleration in a movement path in a y-axis(−) direction, biased acceleration is generated in the y-axis(+) direction. Accordingly, a force-sense is presented in that y-axis(+) direction.

1.3) Conclusion

As described above, in this embodiment, even if the actuators 35 are connected to both sides of the weight 20, the two actuators 35 and the weight 20 are mechanically connected and integral. Therefore, a large control load such as the synchronous control is not required.

In this embodiment, in the first supporting portion 31, for example, the X-actuators 35x are provided on the both sides of the weight 20. Therefore, larger driving force can be generated in comparison with a case where only one X-actuators 35x is provided. This is similar also in the second supporting portion 32.

In this embodiment, the piezoelectric actuator is used as the actuator 35. Therefore, this actuator 35 can be arranged in a narrow clearance between the casing structure 10 and the weight 20 and a reduction in size of the force-sense presenting apparatus 100C an be realized.

In this embodiment, the first supporting portion 31 includes a pair of Y-slide structures 31y and the second supporting portion 32 includes a pair of X-slide structures 32x. Therefore, during vibration in only the x-axis direction, the weight 20 can be greatly displaced in the x-axis direction and the motion of the weight 20 in the y-axis direction, which is different from that axis, can be restricted. Further, during vibration in only the y-axis direction, the weight 20 can be greatly displaced in the y-axis direction and the motion of the weight 20 in the x-axis direction, which is different from that axis, can be restricted.

Other than Patent Literature 1 above, a pseudo-force-sense generating apparatus described in Japanese Patent No. 4413105 that is another Patent Literature is configured to transmit rotational power of a motor to a rotating member (disk) and transmit the rotational power of this rotating member to link mechanisms (two links) connected in a circumference of the rotating member. Accordingly, a crank slider structure is realized and weights 20 are attached to an end portion of the sliding link mechanism. In such an apparatus, a power converting structure realized as a crank slider has a large volume. Thus, it is difficult to reduce the size of the apparatus. Further, for example, the two links generate acceleration in a direction orthogonal to an acceleration direction of the weights 20. Therefore, it becomes unnecessary acceleration and interferes with the efficiency of straight motion of the weights 20.

Note that the above-mentioned slide structure of the force-sense presenting apparatus 100 according to the present technology is not an essential element and the essential element is just to include the pair of supporting structures 315 (and/or 325) on the both sides of the weight 20.

1.4) Experiment Examples of Amount of Displacement of Weight

Figure 5:
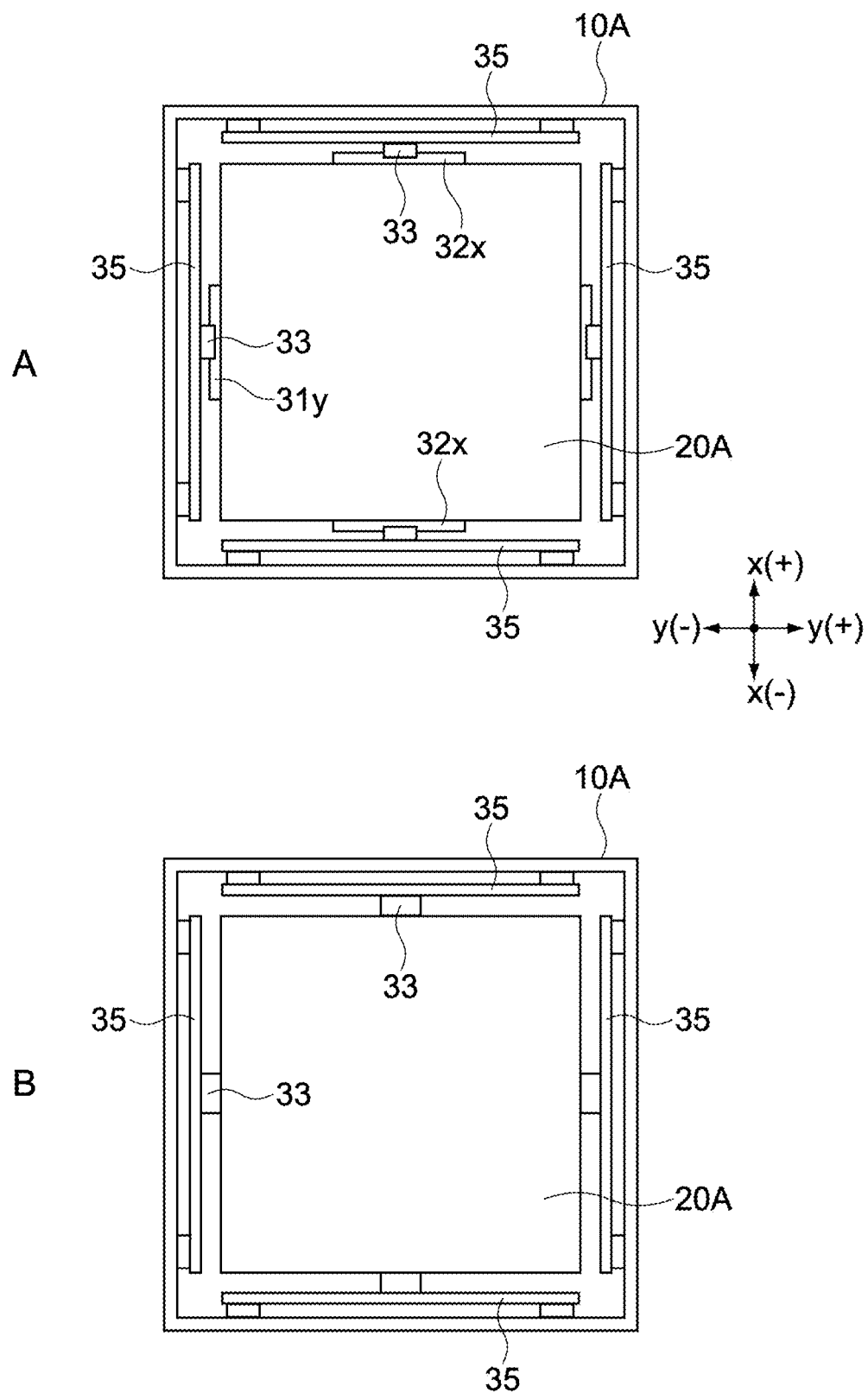
FIG. 5 A of FIG. 5 is a force-sense presenting apparatus with slide structures and B of FIG. 5 shows a configuration of an apparatus without the slide structures.

Using the force-sense presenting apparatus 100 with the slide structures and the apparatus without the slide structures, the inventors experimentally examined an amount of displacement of each of the weights 20A thereof. A and B of FIG. 5 show configuration examples used in this experiment. A of FIG. 5 shows a configuration of a force-sense presenting apparatus with slide structures 31y and 32x. B of FIG. 5 shows a configuration of the apparatus without the slide structures (hereinafter, referred to as apparatus according to comparison example).

In this experiment, a weight 20A having a substantially square outer shape was used and a casing structure 10A having a substantially square outer shape correspondingly to it was used. Linear motion guide structures were used as the slide structures 31y and 32x of the apparatus of A of FIG. 5. As shown in B of FIG. 5, the apparatus according to the comparison example did not include the slide structures and the actuators 35 are directly connected to the weight 20A. The weight of the weight 20A was set to 18 g.

Figure 6:
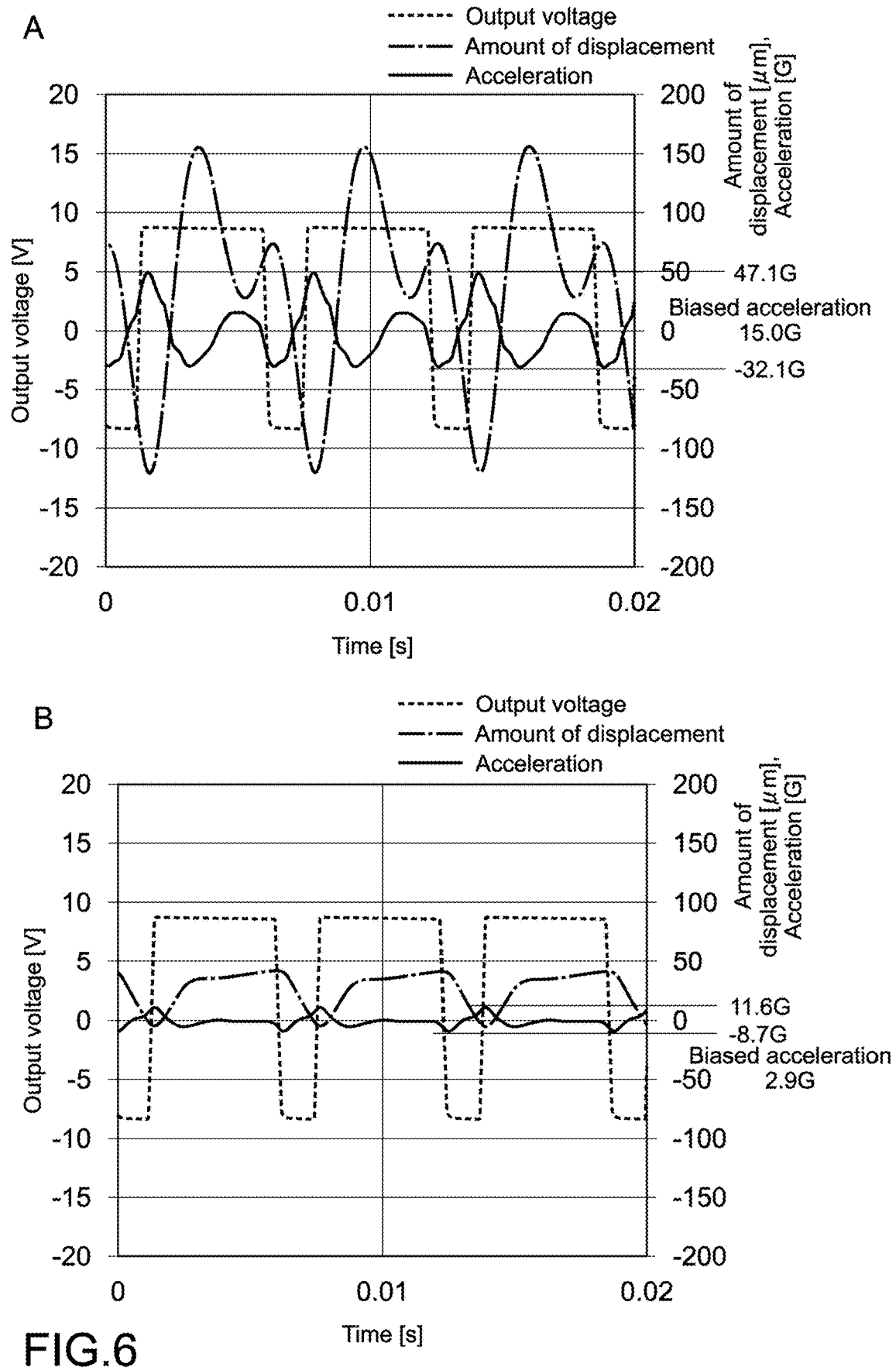
FIG. 6 A of FIG. 6 shows an amount of displacement of the weight of the apparatus with the slide structures shown in A of FIG. 5 and the acceleration that is second order differential of that amount of displacement with a time. B of FIG. 6 shows an amount of displacement of the weight of the apparatus without the slide structures shown in B of FIG. 5.

A of FIG. 6 shows an amount of displacement and the like of the weight 20A of the apparatus with the slide structures. B of FIG. 6 shows an amount of displacement and the like of the weight 20A of the apparatus according to the comparison example. A and B of FIG. 6 show, in addition to the amount of displacement, an output voltage (V) from the control unit (illustration is omitted) to drive units 30 and acceleration (G). Note that it is assumed that the acceleration is measured with an accelerometer in addition to calculation by second order differential of the amount of displacement with a time. These experimental results show results of driving along only one of x- or y-axes.

As shown in B of FIG. 6, the biased acceleration was 2.9 (G) in the comparison example. Meanwhile, as shown in A of FIG. 6, the biased acceleration was 15.0 (G) in the apparatus with the slide structures 31y and 32x. Due to the provision of the slide structures 31y and 32x, connection of the actuator 35 in the axis direction (y-axis direction) different from a driving direction (e.g., x-axis direction) does not obstruct driving force in that driving direction. Therefore, biased acceleration higher than that of the comparison example can be obtained.

Accordingly, as compared to the comparison example, the force-sense presenting apparatus 100 according to this embodiment is capable of presenting a larger force-sense with the same output voltage without increasing the weight and the size of the weight 20A. Therefore, a reduction in size of the apparatus can be realized and the driving loss can be eliminated. Accordingly, the electrical efficiency for driving can be increased.

Figure 7:
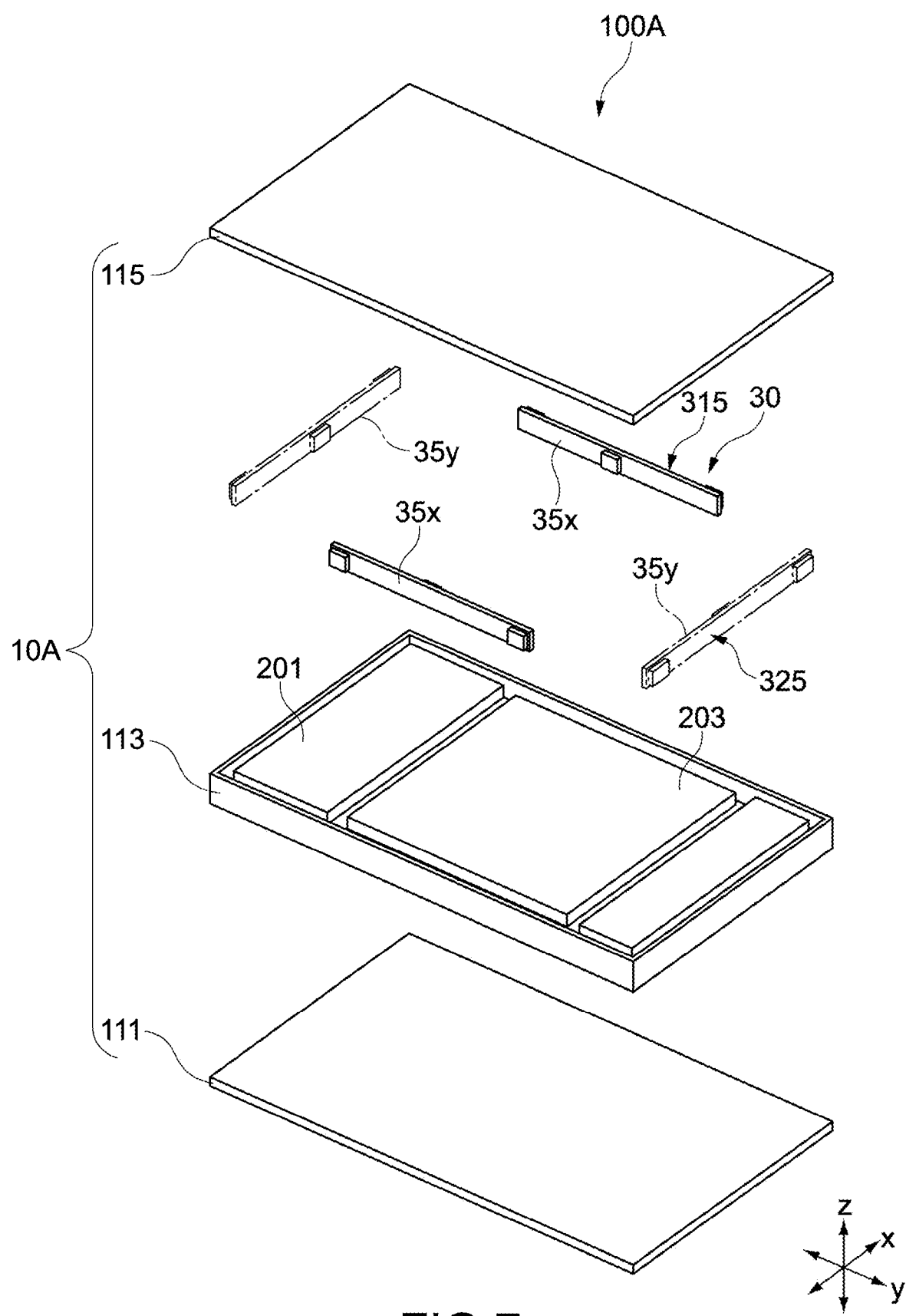
FIG. 7 shows an example in which the force-sense presenting apparatus according to this embodiment is applied to, for example, a portable terminal apparatus.

1.5) Application Example of Force-Sense Presenting Apparatus According to this Embodiment FIG. 7 shows an example in which the force-sense presenting apparatus 100 according to this embodiment is applied to, for example, a portable terminal apparatus. Typically, a device such as a smartphone and a tablet are exemplified as a portable terminal apparatus 100A.

This portable terminal apparatus 100A includes, as the casing structure 10A, a display panel (and a touch panel) 111, a chassis 113, a back panel 115, and the like. Further, the portable terminal apparatus 100A includes, as built-in components, a control board 201, a battery 203, and the like mounted on the chassis 113. These built-in components are connected to the casing structure 10A via drive units 30 (actuators 35 serving as supporting structures).

Here, X-actuators 35x are provided as the drive units 30 shown by the solid lines. Specifically, a pair of supporting structures 315 that perform driving only in the x-axis direction are provided. As a matter of course, as shown by the long dashed short dashed lines, a pair of supporting structures 325 including the Y-actuators 35y that perform driving in the y-axis direction may also be provided for enabling biaxial driving to be performed. Note that the above-mentioned slide structures may be provided or do not need to be provided.

Figure 8:
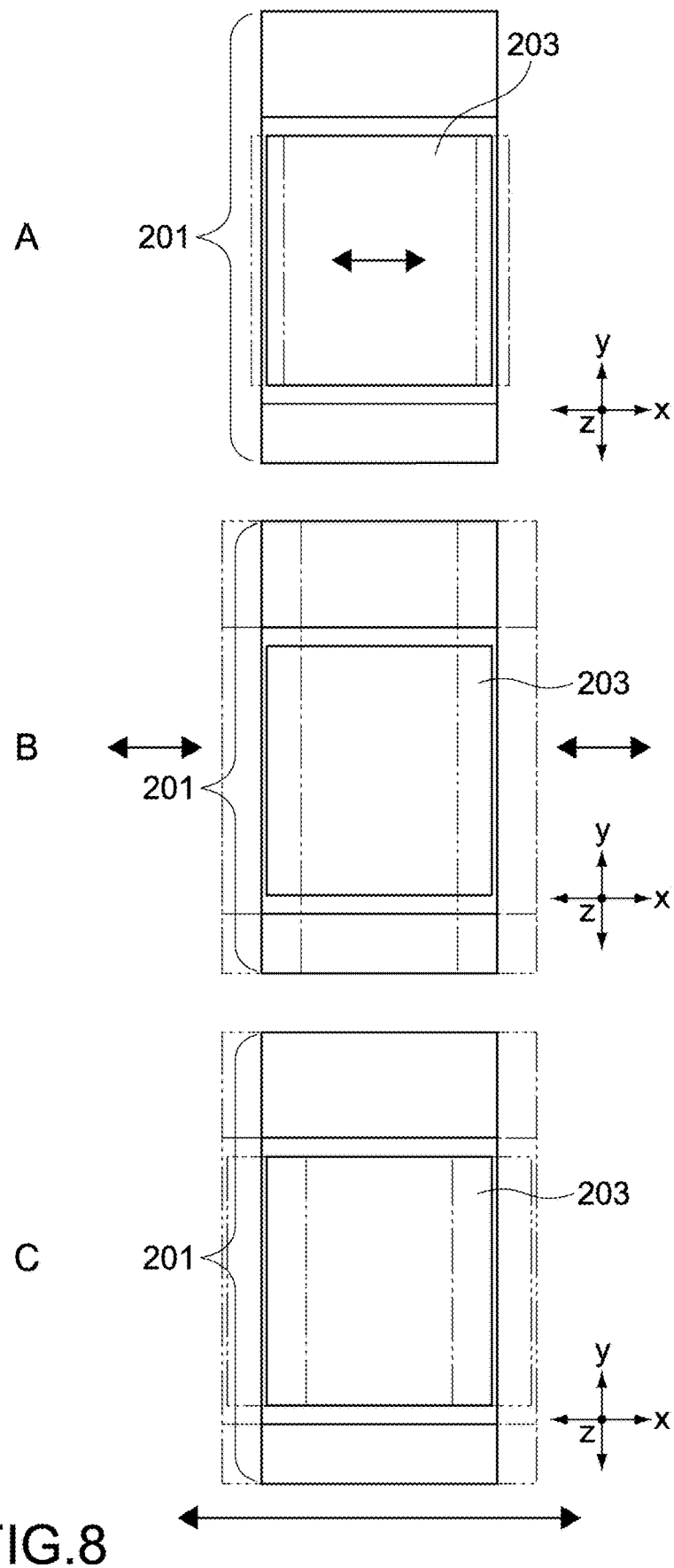
FIG. 8 A to C of FIG. 8 each show a vibration state of an embodiment in which actuators are connected at different positions in a built-in component.

A of FIG. 8 shows an embodiment in which, for example, each of the X-actuators 35x (see FIG. 7) is connected to both sides of the battery 203 in the x-axis direction and is not to connected to the control board 201, out of the built-in components of the portable terminal apparatus 100A. Accordingly, only the battery 203 can be vibrated. In this case, it is favorable that the battery 203 and the control board 201 are electrically connected with a flexible printed board, for example. Note that, in the case of biaxial driving, each of the Y-actuators 35y is connected to the both sides of the battery 203 in the y-axis direction.

B of FIG. 8 shows an embodiment in which, for example, each of the X-actuators 35x (see FIG. 7) is connected to both sides of the control board 201 in the x-axis direction and is not to connected to the battery 203, out of the above-mentioned built-in components. Accordingly, only the control board 201 can be vibrated. In this case, it is favorable that the battery 203 and the control board 201 are electrically connected with a flexible printed board, for example.

C of FIG. 8 shows an embodiment in which, for example, the battery 203 and the control board 201 out of the above-mentioned built-in components are fixed and the entire battery 203 and the entire control board 201 vibrate. In this case, for example, each of the X-actuators 35x may be connected to both sides of the control board 201 in the x-axis direction or each of the X-actuators 35x may be connected to both sides of the battery 203 in the x-axis direction.

As described above, the components of the portable terminal apparatus 100A are used as the weights. Therefore, it is unnecessary to use additional weights. Therefore, a reduction in size of the portable terminal apparatus 100A that is the force-sense presenting apparatus can be achieved.

2. Force-Sense Presenting Apparatuses According to Various Other Embodiments Next, force-sense presenting apparatuses according to various other embodiments will be described. In the following description, substantially similar elements with respect to those of the members, functions, and the like of the force-sense presenting apparatus 100 according to the above-mentioned embodiment will be denoted by identical signs, descriptions thereof will be simplified or omitted, and different points will be mainly described.

2.1) Another Embodiment 1

For example, as described above with reference to FIG. 7, the drive units 30 may be configured to be driven along only one axis. In this case, the drive units 30 may include the actuators on the both sides of the weight 20, as the pair of supporting structures 315.

Figure 9:
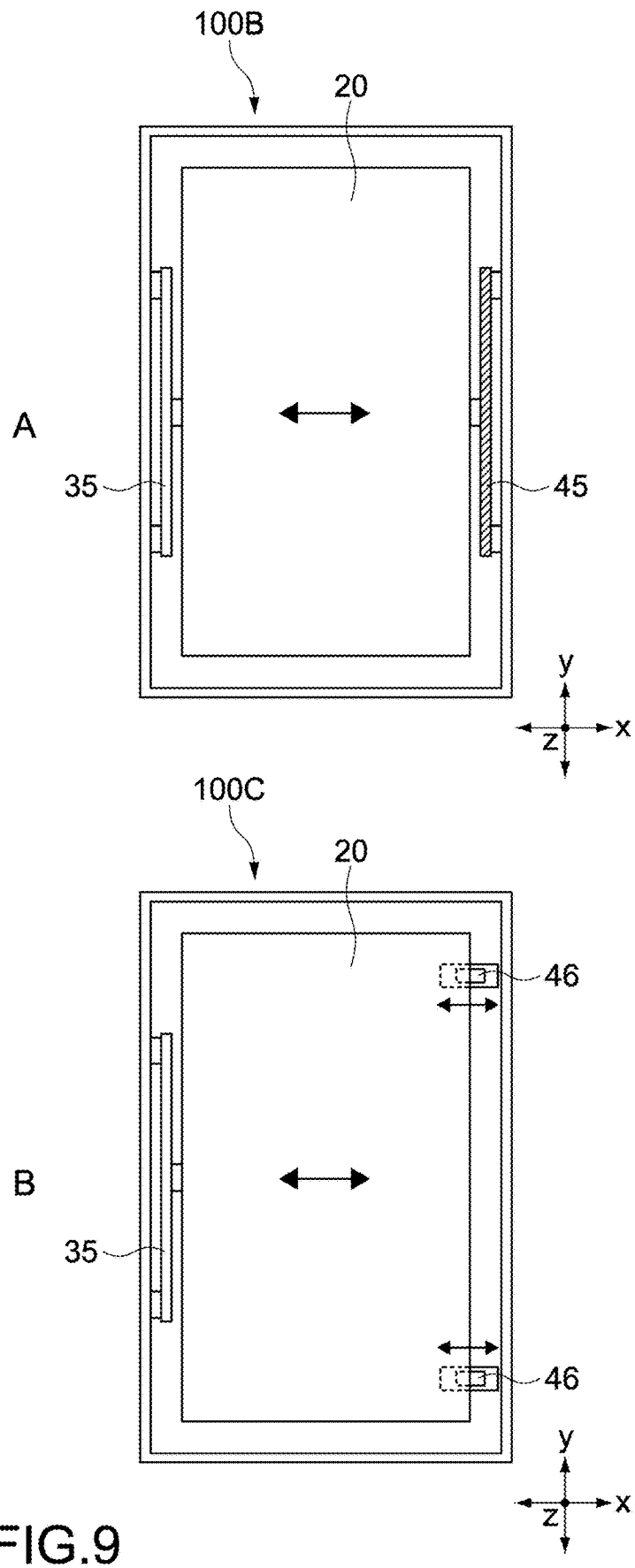
FIGS. 9 A and B of FIG. 9 show an embodiment of the force-sense presenting apparatus on which one of the pair of supporting structures on the both sides of the weight includes an actuator and the other includes a passive drive unit.

Alternatively, as shown in A and B of FIG. 9, one of the pair of supporting structures may include the actuator 35 and the other may be a passive drive unit 45. In a force-sense presenting apparatus 100B shown in A of FIG. 9, a spring structure, in particular, a plate spring structure is employed as the passive drive unit 45. The passive drive unit may be a coil spring structure.

In a force-sense presenting apparatus 100C shown in B of FIG. 9, a plurality of (e.g., two) slide structures 46 are illustrated on one side of the weight 20, as passive drive units. As a matter of course, one slide structure 46 may be provided. A linear motion guide structure, a ball bush structure, or a self-lubricating bearing structure is exemplified as the slide structure as described above.

Alternatively, although not shown in the figure, a plurality of actuators 35 are connected to one side of the weight 20 (e.g., first side 21 (see FIG. 1)) and a plurality of actuators may also be connected to an opposite side thereof (e.g., second side 22). The number of actuators 35 on the both sides may be equal or may be different. Alternatively, the supporting structure connected to the side of the weight 20, which is opposite thereto, may be one or more passive drive units rather than the actuator 35.

2.2) Another Embodiment 2

Although not shown in the figure, in a case where drive units are configured to perform biaxial driving along the two axes of the x- and y-axes, two pairs of supporting structures (combinations of the actuator and the passive drive unit) shown in A or B of FIG. 9 may be provided, for example.

2.3) Another Embodiment 3

Figure 10:
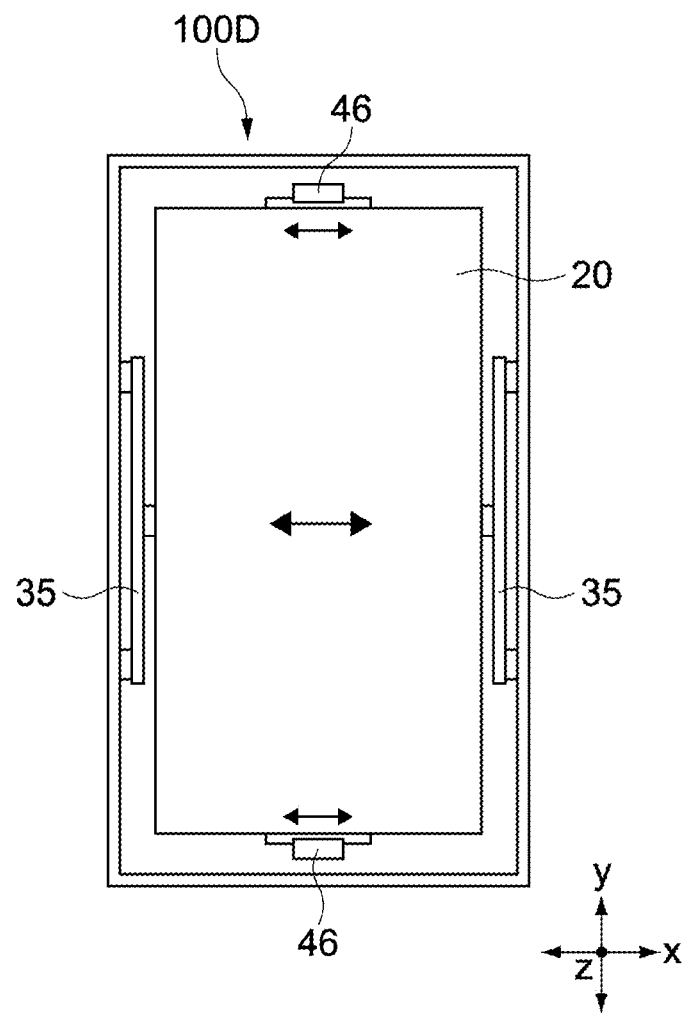
FIG. 10 shows an embodiment of the force-sense presenting apparatus on which the supporting structures on both sides of the weight in one axis direction include the actuators and the supporting structures on both sides of the weight in another axis direction includes the passive drive unit.

As shown in FIG. 10, in a force-sense presenting apparatus 100D in which drive units are configured to be driven along only one axis, each of the pair of supporting structures on the x-axis may be constituted of the actuator 35. The pair of supporting structures on the y-axis may be passive drive units (e.g., slide structures 46 described above) driven in the x-axis direction.

2.4) Another Embodiment 4

Figure 11:
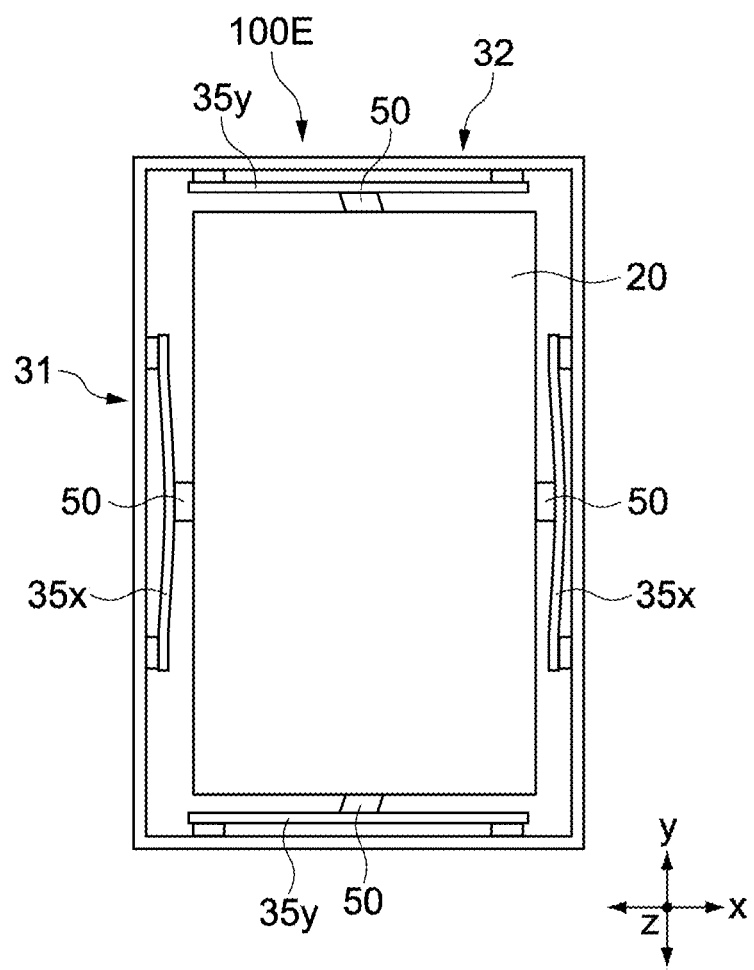
FIG. 11 shows an embodiment of the force-sense presenting apparatus on which supporting structures in two axes include actuators and anisotropic elastic modulus materials.

A force-sense presenting apparatus 100E shown in FIG. 11 includes X-actuators 35x as the pair of supporting structures of the first supporting portion 31 and includes Y-actuators 35y as the pair of supporting structures of the second supporting portion 32. An anisotropic elastic modulus material 50 serving as the slide structure is used as a connection portion provided in each actuator 35 (connection portion with the weight 20).

In a case of an isotropic elastic modulus material, the modulus of longitudinal elasticity E and a shear modulus G are in a relationship of G=E/{2(1+ν)}. Where ν is Poisson's ratio. As the material is viewed in a planar view, the modulus of longitudinal elasticity means an elastic modulus of the material in a short-side direction and the shear modulus means an elastic modulus of the material in a long-side direction. With an elastic material such as a rubber, ν≈0.5, simply, G≈E/3.

A material having, for example, a shear modulus smaller than the modulus of longitudinal elasticity, that is, for example, satisfying G<E/3 is used as the anisotropic elastic modulus material 50. Although E is set to be approximately 20 KPa, for example, E is not limited thereto.

Figure 12:
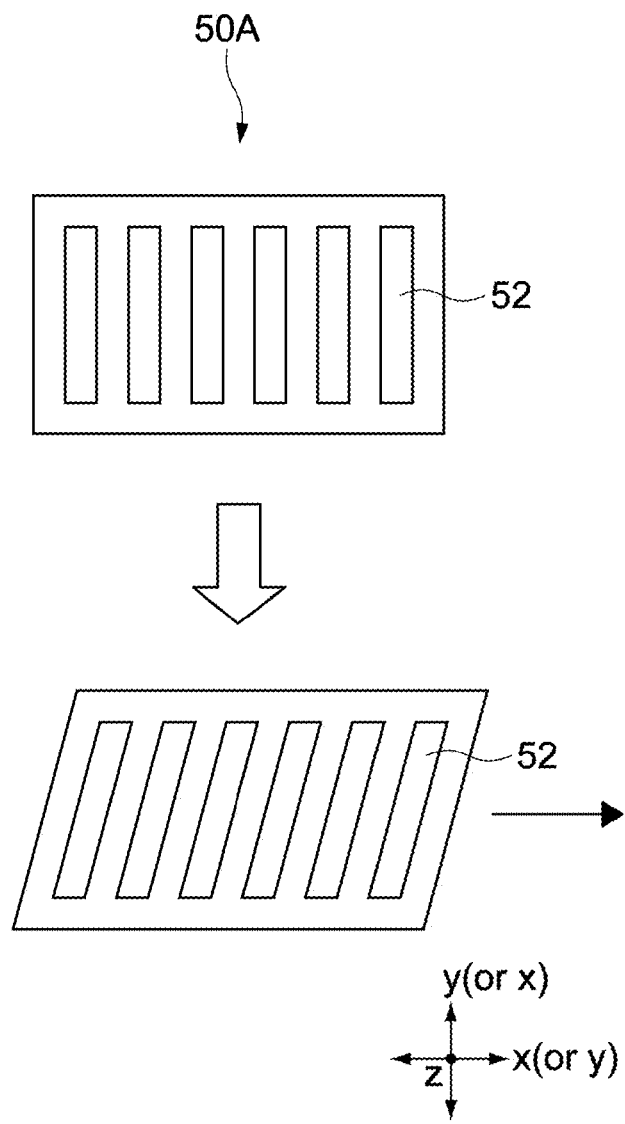
FIG. 12 shows an example of the anisotropic elastic modulus material.

FIG. 12 is a plan view showing an example of such an anisotropic elastic modulus material. This anisotropic elastic modulus material 50A has a ladder structure. Specifically, as shown at the top of FIG. 12, the anisotropic elastic modulus material 50A includes a plurality of holes 52. The plurality of holes 52 are long in the y-direction and arrayed in the x-direction as viewed in the x-y plane, for example. Note that, although it is favorable that the holes 52 pass through the anisotropic elastic modulus material 50A in a z-direction, it is not essential that they pass therethrough.

In the thus configured anisotropic elastic modulus material 50, the shear modulus in the x-direction is smaller than the modulus of longitudinal elasticity in the y-direction. Therefore, this anisotropic elastic modulus material 50 is easily elastically deformed in the x-direction as shown at the bottom of FIG. 12 while it is hardly elastically deformed in the y-direction.

Figure 13:
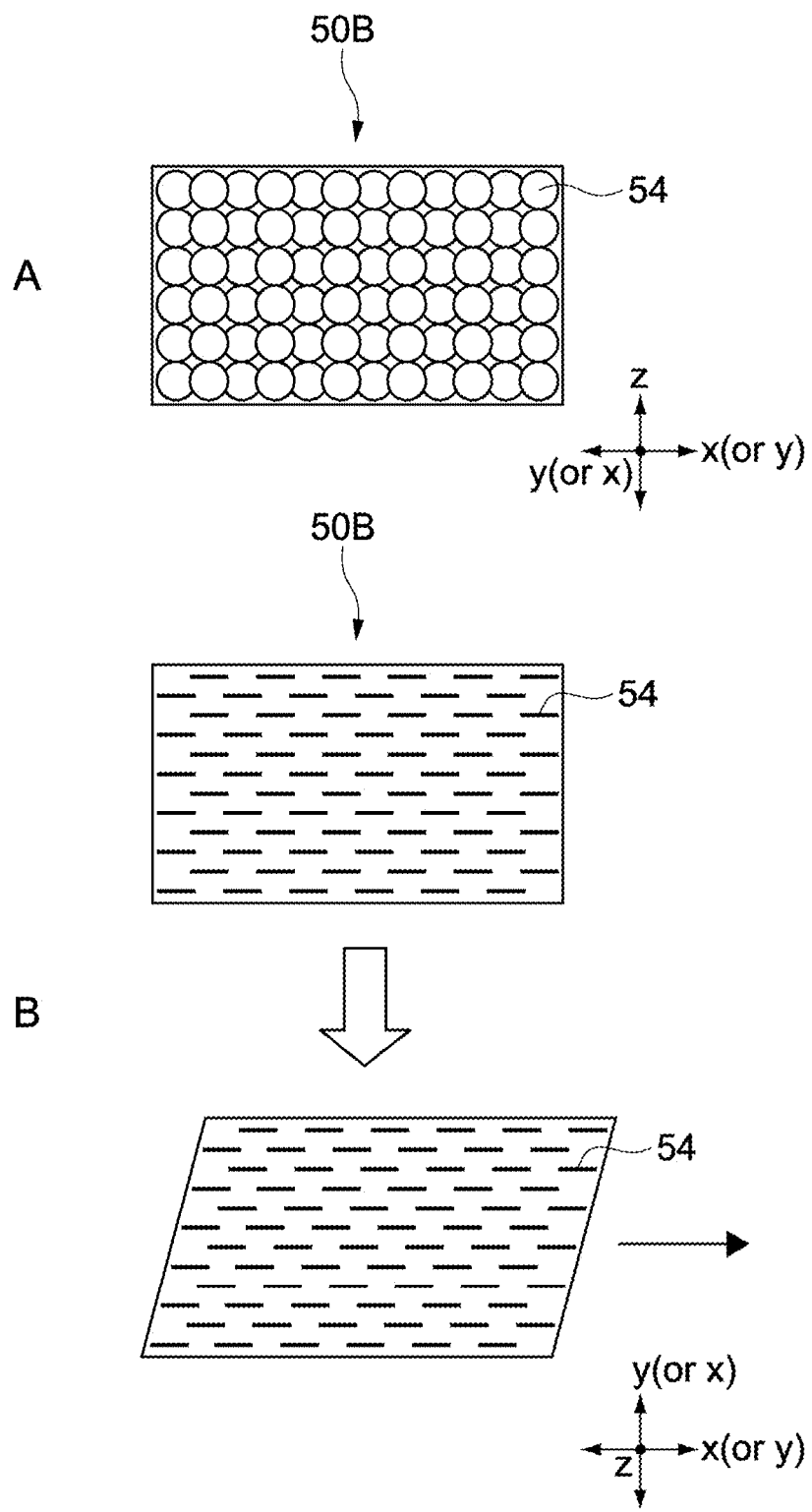
FIGS. 13 A and B of FIG. 13 show another example of the anisotropic elastic modulus material.

A of FIG. 13 is a plan view (cross-sectional view) showing another example of the anisotropic elastic modulus material. This anisotropic elastic modulus material 50B is a synthetic resin material containing disk-like minute particles 54 arranged having directivity as much as possible. The top of B of FIG. 13 is a side view (cross-sectional view) of this anisotropic elastic modulus material 50B. In this manner, for example, as shown at the bottom of B of FIG. 13, the anisotropic elastic modulus material 50B configured such that the shear modulus in the x-direction is smaller than the modulus of longitudinal elasticity in the y-direction can be realized by changing the array of the disk-like minute particles 54.

2.5) Another Embodiment 5

Figure 14:
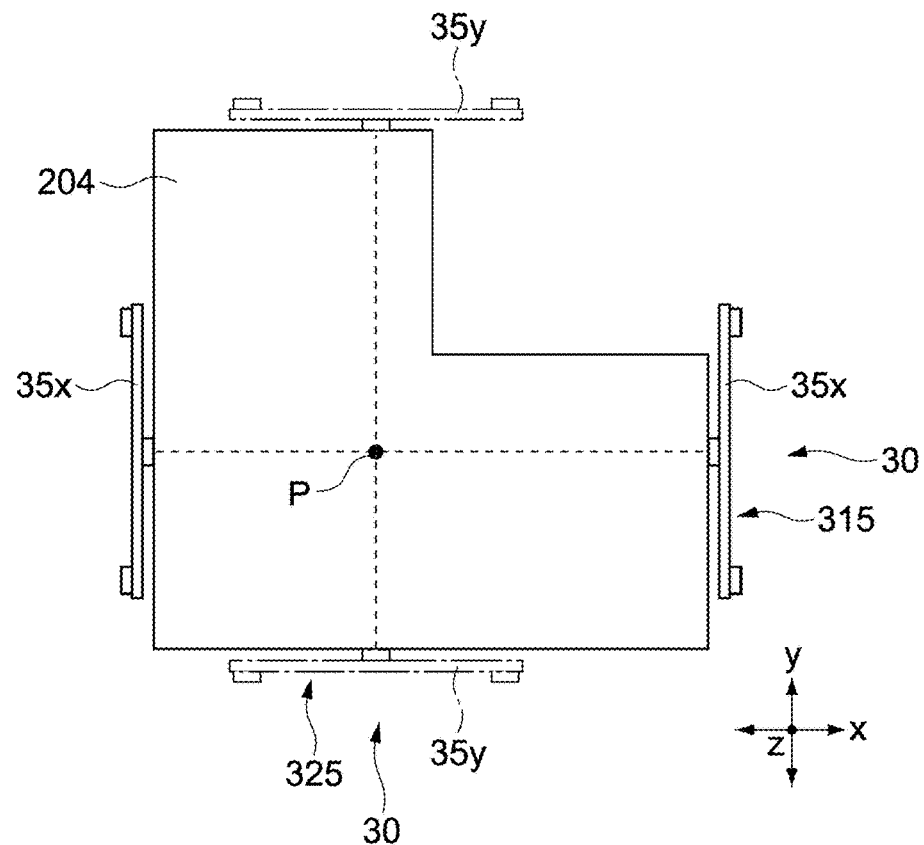
FIG. 14 is a plan view showing a main part of the force-sense presenting apparatus including the weight or the component having an asymmetric shape in a vibration direction.

FIG. 14 is a plan view showing main parts of a force-sense presenting apparatus including a weight having an asymmetric shape in a vibration direction. For example, not the rectangular board but an atypical board is present as the control board of the portable terminal apparatus. If such an atypical board 204 is used as the weight, an arrangement relationship between a atypical board 204 and drive units 30 is configured such that a center of gravity P of the atypical board 204 having the asymmetric shape is positioned on an axis linking connection portions (supporting points) of a pair of supporting structures 315 to each other. The same applies to biaxial driving and the arrangement relationship between the atypical board 204 and the drive units 30 is configured such that the center of gravity P is positioned on an axis linking a pair of supporting structures 325 (shown by the long dashed short dashed lines in the figure) to each other.

If a plurality of supporting structures are connected to one side of the atypical board 204, it is only necessary to consider the center of gravity of each of the connection portions (supporting points) of the plurality of supporting structures. Assuming that this center of gravity is defined as "one-side center of gravity", it is only necessary to design the center of gravity of the weight to be positioned on an axis linking the one-side center of gravity to the connection portion of the supporting structure connected to the other side of the weight. Alternatively, it is only necessary to design it such that the center of gravity of the weight is positioned on an axis linking the one-side center of gravity to a center of gravity (other-side center of gravity) of connection portions of a plurality of supporting structures connected to the other side of the weight.

2.6) Another Embodiment 6

Figure 15:
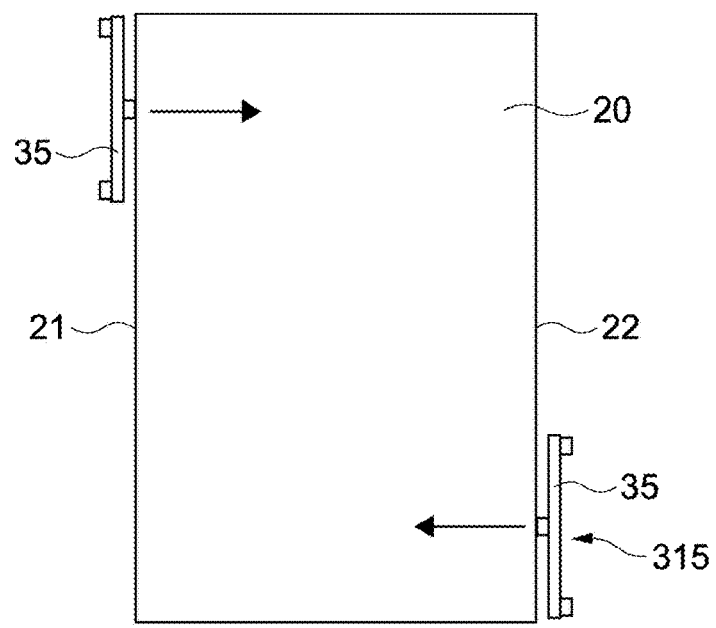
FIG. 15 shows a force-sense presenting apparatus according to still another embodiment.

FIG. 15 shows main parts of a force-sense presenting apparatus according to still another embodiment. In this example, a pair of supporting structures 315 are arranged at positions rotationally symmetric about a center of gravity of a weight 20, on a first side 21 of the weight 20 and a second side 22 opposite thereto. An actuator 35 is applied to each of pair of supporting structures 315, for example.

As shown in FIG. 15, this force-sense presenting apparatus capable of presenting a force-sense of the weight 20 in a rotation direction in such a manner that vibration directions of the actuators 35 are made opposite to each other and biased acceleration is generated as in each of the above-mentioned embodiments.

2.7) Various Other Embodiments

The present technology is not limited to the above-mentioned embodiments and various other embodiments can be realized.

Although, for example, in the above-mentioned embodiments, driving along the x- and y-axes orthogonal to each other has been exemplified as biaxial driving, it is not necessarily limited to the embodiment in which the respective axes are orthogonal to each other. That is, it is not limited to the embodiment in which a direction of an axis line in which a pair of supporting structures are mounted and a direction of an axis line in which another pair of supporting structures are mounted are orthogonal to each other.

Although the drive units 30 that perform uniaxial driving or biaxial driving have been exemplified in each of the above-mentioned embodiments, triaxial driving may be employed. Accordingly, it becomes possible to stereoscopically present force-senses. In this case, for example, an actuator of a supporting structure in the z-axis that is a third axis may have a configuration similar to the above-mentioned piezoelectric actuator. However, it may be a disk-like piezoelectric actuator, for example.

In the embodiment shown in FIG. 7, the battery 203 and/or the control board 201 is used as the weight. However, the display panel, the touch panel, and other components provided in the casing structure as the components may be used as the weights.

At least two characteristic parts of the characteristic parts of the respective embodiments described above can also be combined. For example, the anisotropic elastic modulus material 50 according to Embodiment 4 may be applied as the passive drive unit of any of Embodiments 1 to 3, 5, and 6 above.

Alternatively, the slide structure other than the anisotropic elastic modulus material 50 may be applied to the supporting structure of Embodiment 5 or 6 above, for example.

3. Actuator According to Another Embodiment

Figure 16:
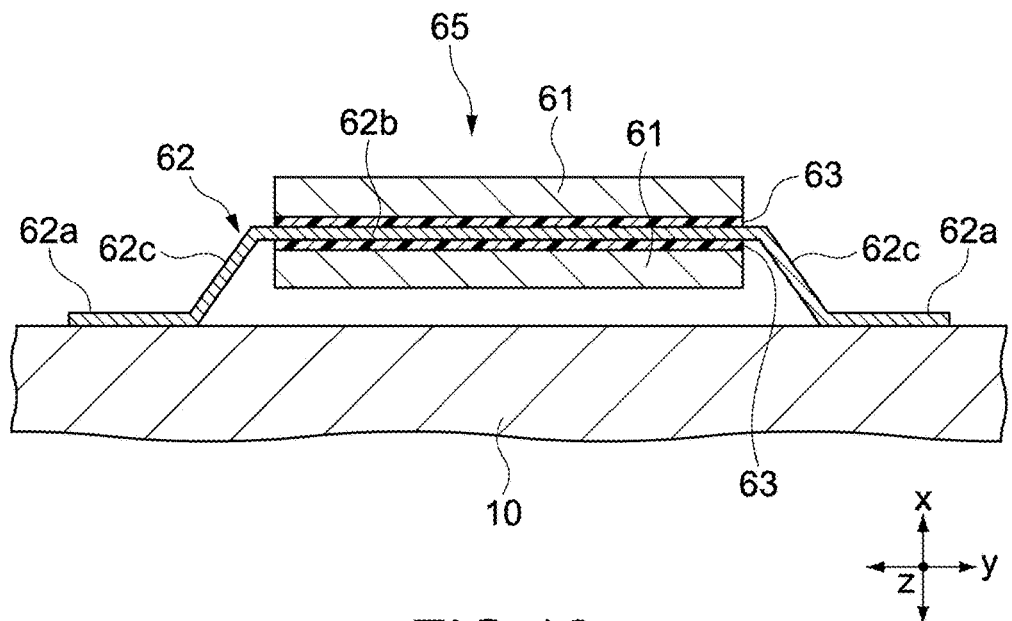
FIG. 16 is a side view or a cross-sectional view showing an actuator according to another embodiment which is connected to the casing structure.
Figure 17:
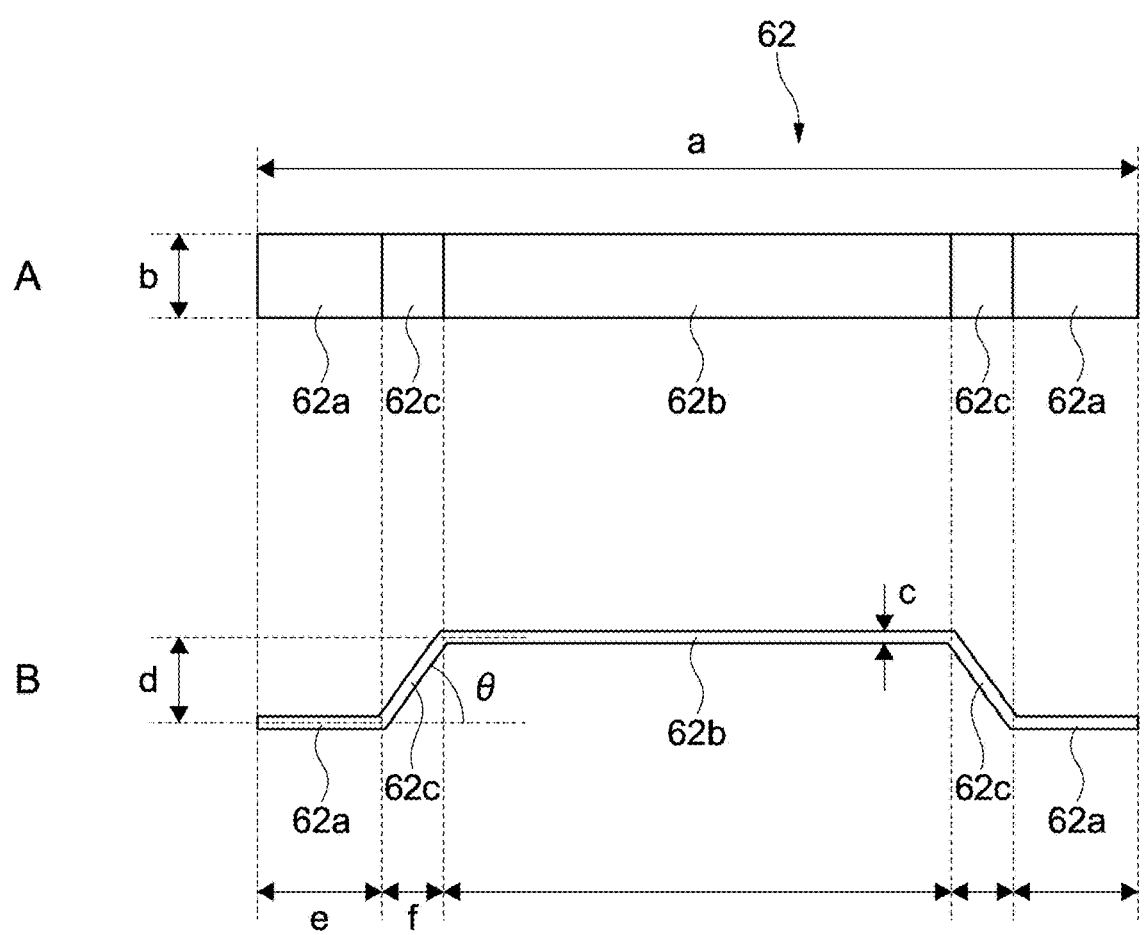
FIG. 17 A of FIG. 17 is a plan view of the shim according to one embodiment and B of FIG. 17 is a side view of the shim.

FIG. 16 is a side view or a cross-sectional view showing an actuator according to another embodiment which is connected to the casing structure 10. An actuator 65 is, for example, a piezoelectric actuator including a plurality of piezoelectric elements 61 and a shim 62 that supports them. Note that, although a bimorph structure in which the two piezoelectric elements 61 are provided as the piezoelectric actuators is shown here, a unimorph structure constituted of one piezoelectric element may be employed. A of FIG. 17 is a plan view of the shim 62 and B of FIG. 17 is a side view of the shim 62.

The shape of the shim 62 has, for example, a long shape. The shim 62 includes fixation portions 62a fixed to the casing structure 10, an attachment portion 62b to which the piezoelectric elements 61 are attached, and bend portions 62c. The bend portion 62c is provided between the fixation portion 62a and the attachment portion 62b.

The fixation portion 62a is provided at each of both end portions of the shim 62, for example. As shown in FIG. 16, for example, the two piezoelectric elements 61 are provided sandwiching the attachment portion 62b of the shim 62 via, for example, adhesive layers 63 made of adhesives.

The bend portion 62c is bent at two positions and configured to be continuous from the fixation portion 62a to the attachment portion 62b. A long-side direction of the fixation portions 62a and a long-side direction of the attachment portion 62b are parallel to each other. The long-side directions of the fixation portions 62a and the attachment portion 62b do not necessarily need to be parallel to each other. Assuming that these long-side directions are a y-direction in FIG. 16, a displacement direction of vibrations of the actuator 65 by the piezoelectric elements 61 is an x-direction substantially orthogonal to the y-direction. A portion of the bend portion 62c, which is inclined with respect to the y-axis, is typically provided having a straight line shape.

One embodiment of the dimension of the shim 62 is shown below (see A and B of FIG. 17). The shim 62 in this case is typically made of metal. Invar, 42 alloy, stainless steel, aluminum, aluminum alloy, or the like is used as the metal.

Length a: 10 mm to 50 mm, more favorably, 20 mm to 40 mm

Width b: 1 mm to 10 mm, more favorably, 2 mm to 5 mm

Thickness c: 0.1 mm to 1 mm, more favorably, 0.2 mm to 0.4 mm

Height d: 1 mm to 10 mm, more favorably, 1.5 mm to 5 mm

Length e of the fixation portions 62a: 0.5 mm to 5 mm, more favorably, 1 mm to 3 mm Length f of the bend portion 62c in the x-direction: 0 mm to 10 mm, more favorably, 0 mm to 5 mm Angle of inclination $\theta$ of the bend portion 62c with respect to the x-direction: $180° < \theta < 0°$ If the length f of the bend portion 62c in the x-direction is 0 mm, the angle of inclination $\theta$ is 0°.

Figures 18, 19:
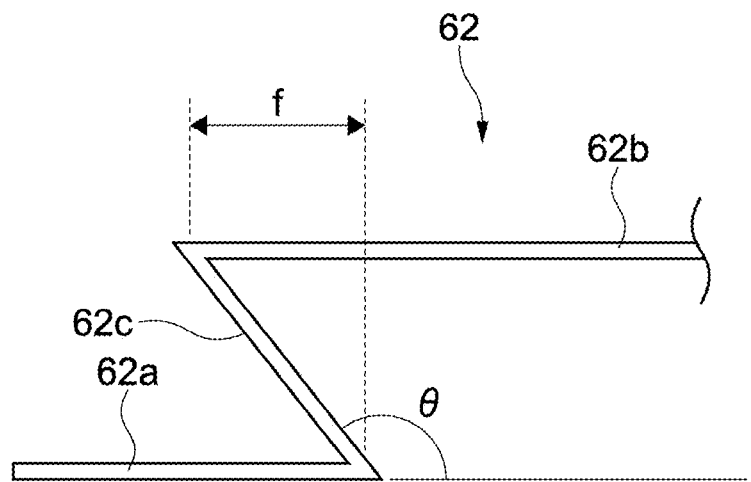
FIG. 18 shows a shim according to an embodiment in which an angle of inclination θ of the bend portion is larger than 90°.
FIG. 19 is a table showing three kinds of dimension embodiments of the bend portion of the shim made of Invar.

The angle of inclination $\theta$ may be larger than 90° as shown in FIG. 18.

Regarding a height d, the thickness of the piezoelectric elements 61 and the thickness of the adhesive layers are used as parameters. The height d depends on an amount of displacement when the actuator 65 operates at a desired vibration frequency. Further, the height d is designed to be such a height that the piezoelectric elements 61 do not come into contact with the casing structure 10 during motion. That is, the actuator 65 is configured to vibrate with a displacement smaller than a difference in height between the fixation portion 62a and the attachment portion 62b.

FIG. 19 is a table showing three dimension embodiments of a bend portion 62c of a shim made of Invar, which has a thickness of 0.2 mm and a height d of 1.54 mm. Further, this table also shows results of simulation analysis of the natural frequency. Physical quantities of an actuator 65 used in this simulation is as follows.

Shim: thickness c=0.2 mm, Young's modulus=145 GPa, density=8.125 g/cm$^3$, Poisson's ratio=0.3

Piezoelectric element: thickness=0.18 mm, Young's modulus: 70 GPa, density: 7.6 g/cm$^3$, Poisson's ratio: 0.3

From FIG. 19, it was confirmed that, when the angle of inclination $\theta$ is in a range of 40° to 90°, the change rate of the natural frequency is equal to or smaller than 4% in comparison with a case where the bending angle is 90°.

As described above, in the actuator 65 according to this embodiment, the fixation portions 62a and the attachment portion 62b are integrated by the shim 62 including the bend portions 62c. It can reduce the number of components of the actuator 65. Further, the actuator 65 can be reduced in height and size and a reduction in size of the force-sense presenting apparatus can be realized.

The bend portion 62c is configured by bending the shim 62 at the two positions, and hence it is possible to provide the shim 62 with the fixation portions 62a, the attachment portion 62b, and the bend portions 62c with a simple structure.

Here, a flexible vibration actuator disclosed in Japanese Patent Application Laid-open No. 2011-129971 includes a base plate or a vibration plate in addition to a shim. Therefore, the thickness of the actuator increases and it is difficult to install it in a small and thin electronic apparatus. Further, small precision components are used in this actuator. Therefore, the machining man-hour and the assembling man-hour increase, which increases the manufacture costs.

On the other hand, in a piezoelectric actuator disclosed in Japanese Patent Application Laid-open No. 2013-31040, the number of components is small but it is necessary to provide a gap between an upper or lower surface and a support in order to increase the amount of displacement. Therefore, it is inappropriate for being incorporated in a small and thin electronic apparatus. Further, if a silicone resin is filled in between the support and the piezoelectric element, it is also conceivable that a silicone resin is deteriorated due to repeated long-term vibrations.

In the present technology, the shim 62 constitutes the fixation portions 62a, the attachment portion 62b, and the bend portions 62c and the configuration of the actuator 65 is realized with a simple structure. Therefore, the problems as in Literatures above can be solved.

Figure 20:
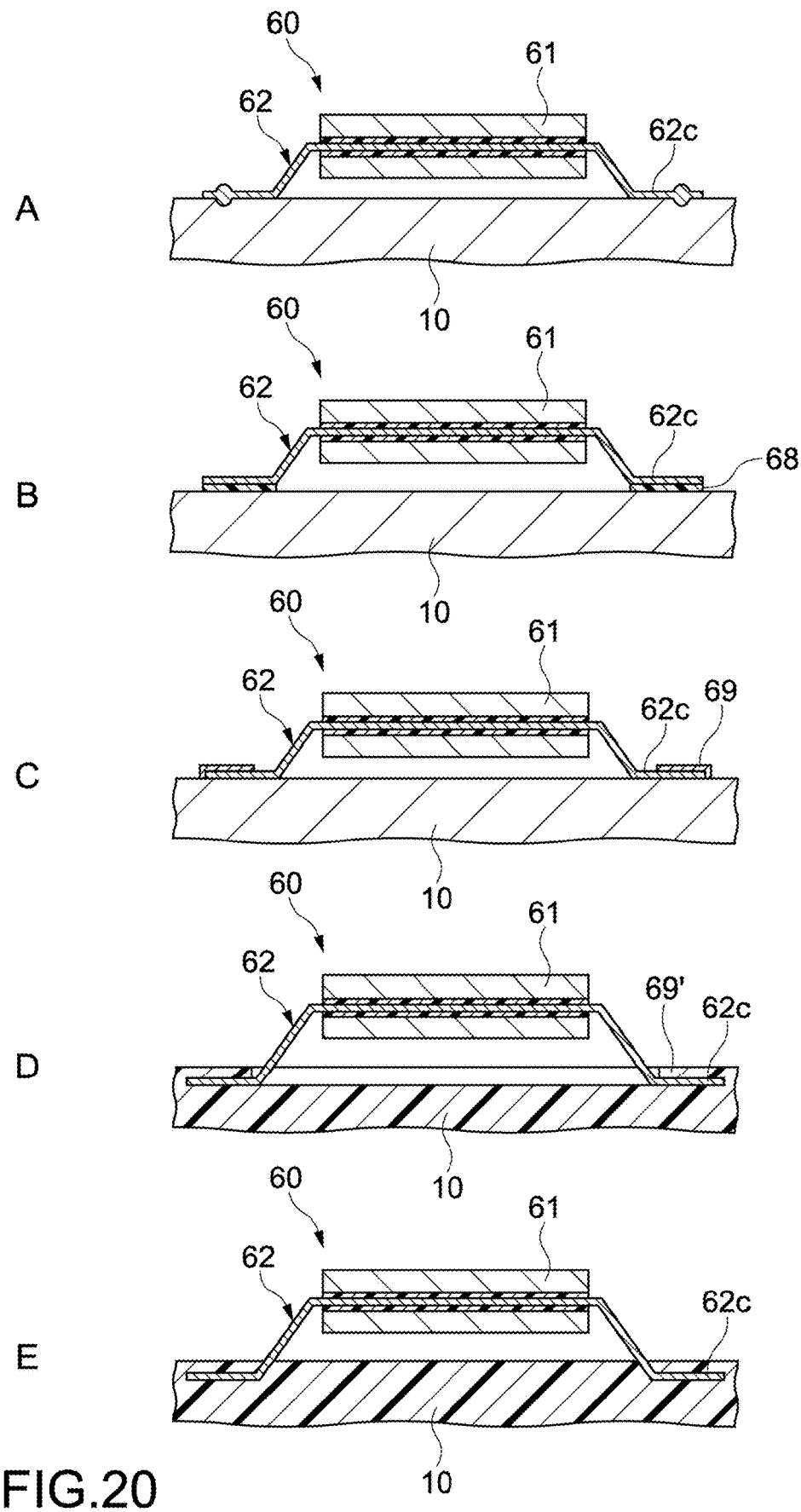
FIG. 20 A to E of FIG. 20 show an example in which a plurality of fixation structures of the fixation portion of the shim.

A to E of FIG. 20 show a plurality of examples of the fixation structures of the fixation portions 62a of the shim 62.

In the example shown in A of FIG. 20, the fixation portions 62a are fixed to the casing structure 10 by welding. For example, if the shim 62 and the casing structure 10 are both made of metal, they are fixed to each other by welding. If the shim 62 and the casing structure 10 are both resins, they are fixed by welding using ultrasonic bonding or the like.

In the example shown in B of FIG. 20, the fixation portions 62a are fixed to the casing structure 10 with an adhesive layer 68 such as a double-sided adhesive tape. In this case, the shim 62 is not limited to metal and a resin or a rubber may be employed. The casing structure 10 is also not limited to metal.

In the example shown in C of FIG. 20, the fixation portions 62a and the casing structure 10 are fixed to each other by mechanical engagement. For example, the casing structure 10 is provided with hook portions 69 and the fixation portions 62a are engaged in the hook portions 69. The pair of hook portions 69 are provided in the casing structure 10 in such a manner that respective opening surfaces thereof face each other. The hook portions 69 may be formed of the same material as the material of the casing structure 10 or may be formed of a different material.

As shown in D of FIG. 20, a height position of a surface of a hook portion 69' may be substantially identical to a height position of the surface (inner wall surface) of the casing structure 10. In this case, the hook portions 69' and the casing structure 10 may be integrally formed of the same material. Metal or a resin is used as the material of the casing structure 10.

In the example shown in E of FIG. 20, the shim 62 is fixed to the casing structure 10 by the fixation portions 62a being embedded in the casing structure 10. If the casing structure 10 is made of a resin, the fixation portions 62a can be embedded in the casing structure 10 by insert molding, for example. As a matter of course, it is not limited to insert molding.

Figure 21:
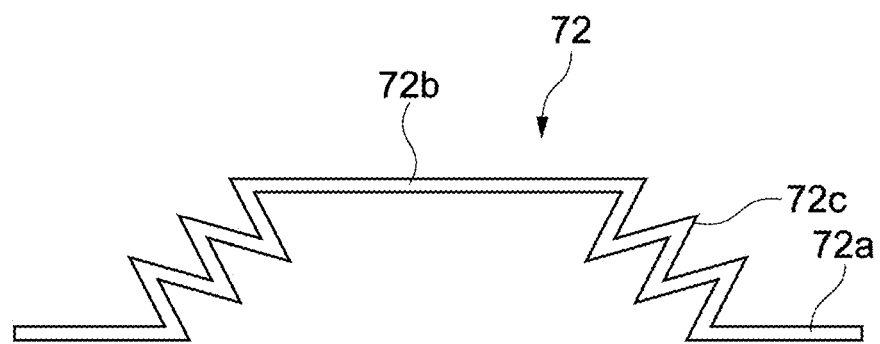
FIG. 21 is a side view or a cross-sectional view showing an actuator according to still another embodiment.

FIG. 21 is a side view or a cross-sectional view showing the shim of the actuator according to still another embodiment. A shim 72 includes fixation portions 72a, an attachment portion 72b, and bend portions 72c having a bellows shape. Accordingly, the displacement can be made larger.

Figure 22:
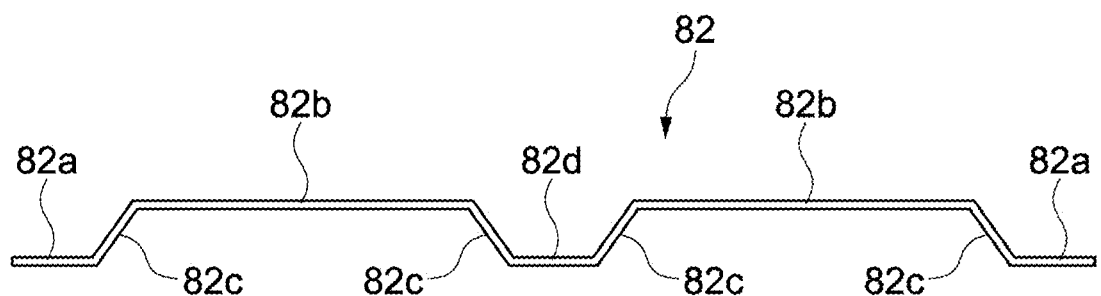
FIG. 22 is a side view showing a shim of the actuator according to still another embodiment.

FIG. 22 is a side view showing a shim of an actuator according to still another embodiment. This shim 82 includes a plurality of (here, two) attachment portions 82b and a piezoelectric element is attached to each of these attachment portions 82b. Further, the shim 82 includes a single common fixation portion 82d in addition to fixation portions 82a respectively provided at both ends thereof. Accordingly, a reduction in size of the actuator can be achieved in an array direction (left and right directions in figure) of the piezoelectric elements (not shown here) while the driving force can be increased. Portions indicated by the sign 82c are bend portions.

Figure 23:
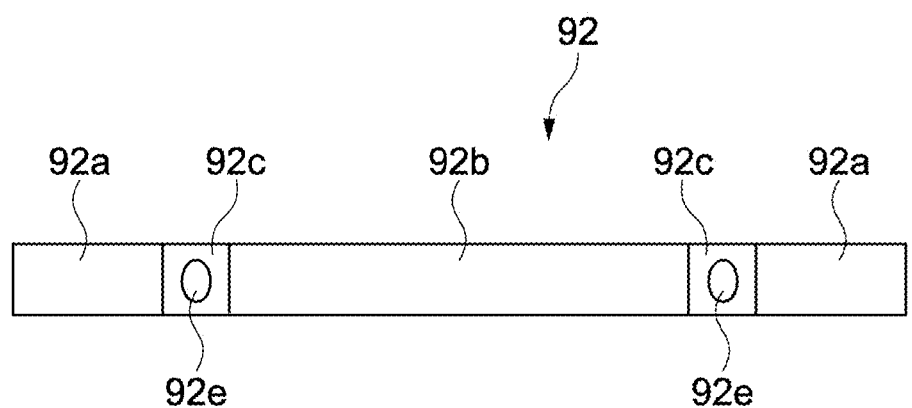
FIG. 23 is a plan view showing the actuator according to still another embodiment.

FIG. 23 is a plan view showing a shim of an actuator according to still another embodiment. This shim 92 includes bend portions 92c. An aperture 92e is provided in the bend portion 92c. During manufacture for the actuator, the size, the shape, and/or the position of the aperture 92e can be appropriately adjusted. Accordingly, the weight and/or rigidity of the shim 92 is adjusted. It is possible to adjust the amount of displacement and driving force and the natural frequency of the actuator. Portions indicated by the sign 92a is fixation portions and a portion indicated by the sign 92b is an attachment portion.

The shape of the aperture 92e is not limited to the circle and may be a long hole, an oval, a slit, or the like. The position at which the aperture 92e is provided is not limited to the bend portion 92c and may be the attachment portion 62b.

4. Force-Sense Presenting Apparatuses Using Actuators According to Other Embodiments A to C of FIG. 24 and A to C of FIG. 25 show configurations of force-sense presenting apparatuses using the actuators according to the other embodiments described above.

Figure 24:
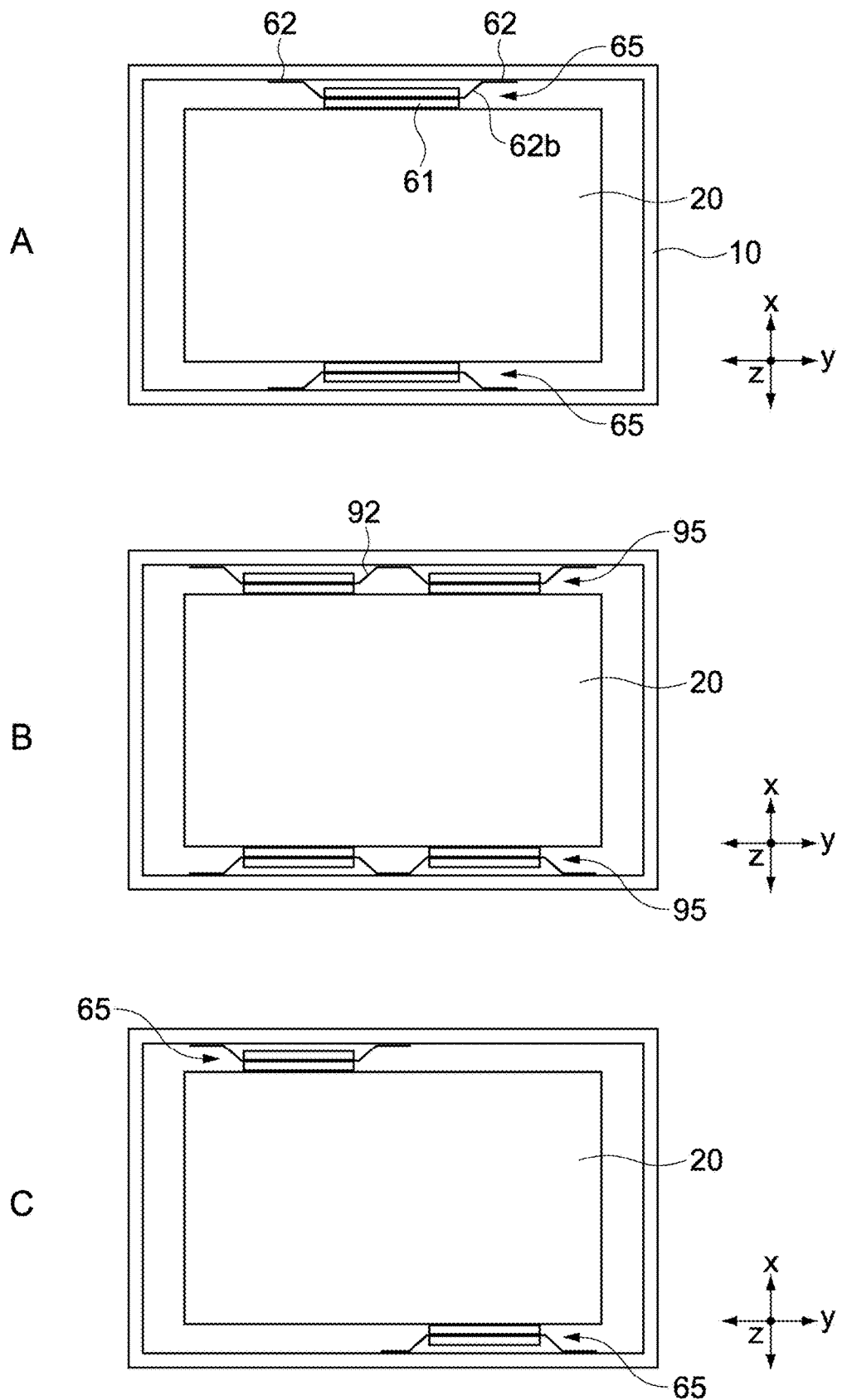
FIG. 24 A to C of FIG. 24 show a configuration of the force-sense presenting apparatus (with the slide structures) using the actuator according to the other embodiment.
Figure 25:
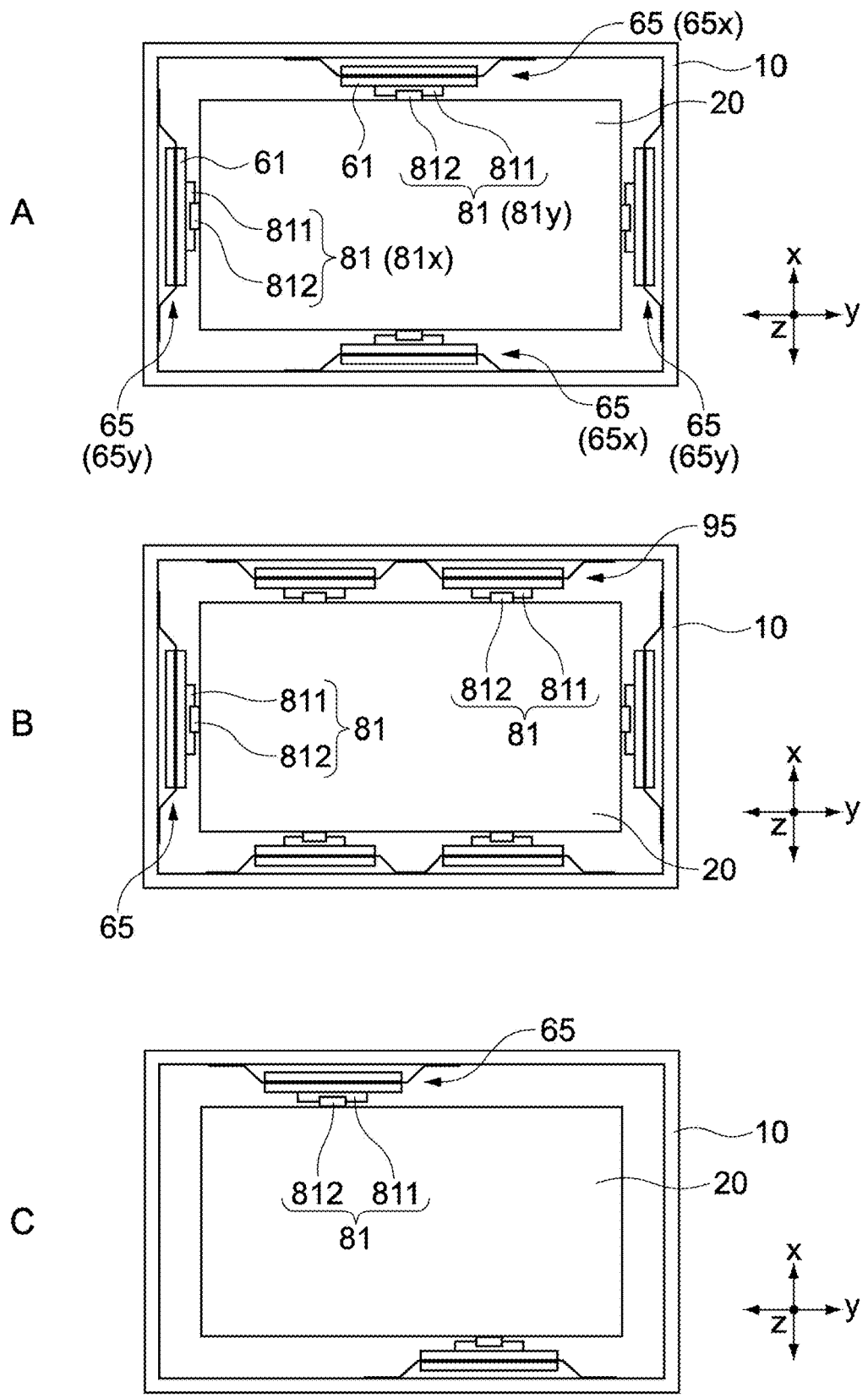
FIG. 25 A to C of FIG. 25 show a configuration of the force-sense presenting apparatus (without the slide structures) using the actuator according to the other embodiment.

In the example shown in A of FIG. 24, two actuators 65 are connected to the weight 20 to be opposed to each other in the x-direction. Specifically, piezoelectric elements 61 of the actuators 65 are fixed to the weight 20. Accordingly, the actuator 65 is capable of generating acceleration or biased acceleration in the weight 20. In this case, the arrangement of the actuators 65 does not need to be the symmetric arrangement about the center of gravity of the weight 20.

The two actuators 65 may be connected to the weight 20 to be opposed to each other in not the x-direction but the y-direction.

In the example shown in B of FIG. 24, actuators 95 of the shim 92 to which the plurality of piezoelectric elements shown in FIG. 22 can be attached are provided to be opposed to each other in the x-direction. If driving force is insufficient with one piezoelectric element 61 in comparison with the weight 20, this embodiment is effective.

In the example shown in C of FIG. 24, as on the embodiment shown in FIG. 15, actuators 65 are provided at rotationally symmetric positions about the center of gravity of the weight 20. With such a configuration, the weight 20 is rotatable in a predetermined angle range about that center of gravity.

In the example shown in A of FIG. 25, in the first supporting portions provided to be opposed to each other in the x-direction, two actuators 65 (X-actuators 65x) are connected to Y-slide structures 81y. Further, in the second supporting portions provided to be opposed to each other in the y-direction, two actuators 65 (Y-actuators 65y) are connected to X-slide structures 81x.

The X-slide structures 81x and the Y-slide structures 81y have similar configurations. They will be simply referred to as "slide structures" hereinafter. A slide structure 81 includes a slide base 811 and a slider 812 that moves along the slide base 811. The slide base 811 is attached to the piezoelectric element 61 of the actuator 65 and the slider 812 is attached to the weight 20.

In the example shown in B of FIG. 25, in the first supporting portions provided to be opposed to each other in the x-direction, actuators 95 (see B of FIG. 24) including the two piezoelectric elements 61 are provided on opposed sides of the weight 20, respectively. Further, in the second supporting portions provided to be opposed to each other in the y-direction, one actuator 65 is provided to each of the opposed sides of the weight 20. The slide structure 81 is connected to each piezoelectric element.

In the example shown in C of FIG. 25, as on the embodiments shown in FIG. 15 and C of FIG. 24, the actuator 65 and the slide structure 81 are provided at rotationally symmetric positions about the center of gravity of the weight 20. With such a configuration, the weight 20 becomes rotatable in a predetermined angle range about that center of gravity.

It is desirable that the actuators shown in A and B of FIG. 24 and A and B of FIG. 25 be arranged to be symmetric (mirror-symmetric) with respect to the x- and/or y-axis passing through the center of gravity of the weight 20. The actuators 65 shown in C of FIG. 25 are arranged to be rotationally symmetric about the center of gravity of the weight 20, though it is not necessarily so.

5. Various Other Embodiments of Actuator or Force-Sense Presenting Apparatus

In the above description, the bend portion of the shim is inclined and provided in the straight line shape or in the bellows shape. However, the bend portion of the shim may be provided in a curve shape.

At least two characteristic parts of characteristic parts of the actuator and/or the force-sense presenting apparatus according to each of the above-mentioned embodiment can also be combined.

For example, at least one embodiment of the embodiments shown in FIG. 23 and A to E of FIG. 20 may be applied to one of the embodiments of FIGS. 22, 24, and 25.

For example, the actuators opposed to each other in the y-direction may be further provided on the embodiments shown in C of FIG. 24 or C of FIG. 25. In this case, each of the actuators opposed to each other in the y-direction may be arranged to be rotationally symmetric about the center of gravity of the weight 20 or may be arranged to be symmetric (mirror-symmetric) with respect to the x-axis.

In the above, the smartphone or the tablet has been exemplified as the portable terminal apparatus to which the force-sense presenting apparatus of the present technology is applied. However, the portable terminal apparatus is also applicable to, for example, wearable terminals such as watches, eyeglasses, hats, shoes, clothes, and bands (wrist band, ring). Not limited to the wearable terminals, it is also applicable to digital cameras, sticks for persons with disabilities, and the like.

It should be noted that the present technology may also take the following configurations.

(1)
A force-sense presenting apparatus, including:
a casing structure;
a weight provided in the casing structure or incorporated in the casing structure; and
a drive unit including
a first supporting portion constituted of a pair of supporting structures that support a first side of the weight and a second side opposed to the first side, at least one of the pair of supporting structures being configured to include an actuator capable of providing the weight with biased acceleration.

(2)
The force-sense presenting apparatus according to (1), in which
the actuator is configured to generate first biased acceleration in a direction from the first side to the second side of the weight or a direction from the second side to the first side.

(3)
The force-sense presenting apparatus according to (2), in which
if one of the pair of supporting structures is the actuator, another of the pair of supporting structures includes a passive drive unit configured to be driven in an axis direction including the direction of the first biased acceleration.

(4)
The force-sense presenting apparatus according to (3), in which
the passive drive unit has a linear motion guide structure, a ball bush structure, a self-lubricating bearing structure, or an anisotropic elastic modulus material.

(5)
The force-sense presenting apparatus according to (2), further including
a second supporting portion constituted of a pair of supporting structures respectively provided on a third side different from the first side and the second side of the weight and on a fourth side opposed thereto.

(6)
The force-sense presenting apparatus according to (5), in which
the pair of supporting structures that constitute the second supporting portion each include a slide structure that slides in an axis direction including the direction of the first biased acceleration.

(7)
The force-sense presenting apparatus according to (6), in which
at least one of the pair of supporting structures that constitute the second supporting portion is configured to include an actuator capable of providing second biased acceleration in a direction from the third side to the fourth side of the weight or a direction from the fourth side to the third side, and
the pair of supporting structures that constitute the first supporting portion each include a slide structure that slides in an axis direction including the direction of the second biased acceleration.

(8)
The force-sense presenting apparatus according to (6) or (7), in which the slide structure is a linear motion guide structure, a ball bush structure, a self-lubricating bearing structure, or an anisotropic elastic modulus material.

(9)

The force-sense presenting apparatus according to (1), in which both of the pair of supporting structures that constitute the first supporting portion each include the actuator.

(10)

The force-sense presenting apparatus according to (5), in which both of the pair of supporting structures that constitute the second supporting portion each include the actuator.

(11)

The force-sense presenting apparatus according to any one of (1) to (10), in which the weight is a component constituting a part of the casing structure or a component incorporated in the casing structure.

(12)

The force-sense presenting apparatus according to (11), in which the force-sense presenting apparatus is a portable terminal apparatus, and the component is a battery, a control board, a display panel, or a touch panel.

(13)

The force-sense presenting apparatus according to any one of (1) to (12), in which the actuator includes
a piezoelectric element, and
a shim including
a fixation portion fixed to the casing structure,
an attachment portion to which the piezoelectric element is attached, and
a bend portion provided between the fixation portion and the attachment portion.

(14)

The force-sense presenting apparatus according to (13), in which the actuator is configured to vibrate with a displacement smaller than a difference in height between the fixation portion and the attachment portion, the difference in height being formed by the bend portion.

(15)

The force-sense presenting apparatus according to (13) or (14), in which the bend portion is provided between the attachment portion and the fixation portion by bending the shim at at least two positions thereof.

(16)

The force-sense presenting apparatus according to (15), in which the bend portion has a portion between the attachment portion and the fixation portion, the portion being formed in a straight line shape, a curve shape, or a bellows shape.

(17)

The force-sense presenting apparatus according to any one of (13) to (16), in which the fixation portion is fixed to the casing structure by welding, adhesion with an adhesive, mechanical engagement, or embedding.

(18)

The force-sense presenting apparatus according to any one of (13) to (17), in which the attachment portion of the shim includes two or more attachment portions, and the fixation portion of the shim is common between the two attachment portions.

(19)

The force-sense presenting apparatus according to any one of (13) to (18), in which the shim includes an aperture.

REFERENCE SIGNS LIST 10, 10A . . . casing structure
20, 20A . . . weight
21 . . . first side
22 . . . second side
23 . . . third side
24 . . . fourth side
30 . . . drive unit
31 . . . first supporting portion
31$y$ . . . Y-slide structure
32 . . . second supporting portion
32$x$ . . . X-slide structure
33, 34 . . . connection portion
35$x$, 65$x$ . . . X-actuator
35$y$, 65$y$ . . . Y-actuator
35, 65, 95 . . . actuator
45 . . . passive drive unit
46 . . . slide structure
50, 50A, 50B . . . anisotropic elastic modulus material
61 . . . piezoelectric element
62, 72, 82, 92 . . . shim
62$a$, 72$a$, 82$a$, 92$a$ . . . fixation portion
62$b$, 72$b$, 82$b$, 92$b$ . . . attachment portion
62$c$, 72$c$, 82$c$, 92$c$ . . . bend portion
68 . . . adhesive layer
69 . . . hook portion
81 . . . slide structure
92$e$ . . . aperture
100, 100B, 100C, 100D, 100E . . . force-sense presenting apparatus
100A . . . portable terminal apparatus
113 . . . chassis
115 . . . back panel
201 . . . control board
203 . . . battery
204 . . . atypical board
315 . . . pair of supporting structures of first supporting portion
325 . . . pair of supporting structures of second supporting portion

The invention claimed is:

1. A force-sense presenting apparatus, comprising:
a casing structure;
a weight provided in the casing structure or incorporated in the casing structure; and
a drive unit including
a first supporting portion constituted of a first pair of supporting structures that support a first side of the weight and a second side opposed to the first side, at least one of the first pair of supporting structures being configured to include a first actuator that provides the weight with first biased acceleration, and
a second supporting portion constituted of a second pair of supporting structures that support a third side of the weight, different from the first side and the second side of the weight and a fourth side opposed to the third side, at least one of the second pair of supporting structures being configured to include a second actuator that provides the weight with second biased acceleration, wherein the first pair of supporting structures each include a first slide structure that slides in an axis direction including the direction of the second biased acceleration and the second pair of supporting structures each include a second slide structure that slides in an axis direction including the direction of the first biased acceleration.

2. The force-sense presenting apparatus according to claim 1, wherein
if one of the pair of supporting structures of the first supporting portion includes the first actuator, another of the pair of supporting structures of the first supporting portion includes a passive drive unit configured to be driven in an axis direction including the direction of the first biased acceleration.

3. The force-sense presenting apparatus according to claim 1, wherein
the first and second slide structures each include a linear motion guide structure, a ball bush structure, a self-lubricating bearing structure, or an anisotropic elastic modulus material.

4. The force-sense presenting apparatus according to claim 1, wherein
the pair of supporting structures that constitute the first supporting portion each include the first actuator.

5. The force-sense presenting apparatus according to claim 1, wherein
the force-sense presenting apparatus is a portable terminal apparatus, and
the weight is a battery, a control board, a display panel, or a touch panel.

6. The force-sense presenting apparatus according to claim 1, wherein
the first and second actuators each include
a piezoelectric element, and
a shim including
a fixation portion fixed to the casing structure,
an attachment portion to which the piezoelectric element is attached, and
a bend portion provided between the fixation portion and the attachment portion.

7. The force-sense presenting apparatus according to claim 6, wherein
each of the first and second actuators is configured to vibrate with a displacement smaller than a difference in height between the fixation portion and the attachment portion, the difference in height being formed by the bend portion.

8. The force-sense presenting apparatus according to claim 6, wherein
the bend portion is provided between the attachment portion and the fixation portion by bending the shim at at least two positions thereof.

9. The force-sense presenting apparatus according to claim 8, wherein
the bend portion has a portion between the attachment portion and the fixation portion, the portion being formed in a straight line shape, a curve shape, or a bellows shape.

10. The force-sense presenting apparatus according to claim 6, wherein
the fixation portion is fixed to the casing structure by welding, adhesion with an adhesive, mechanical engagement, or embedding.

11. The force-sense presenting apparatus according to claim 6, wherein
the attachment portion of the shim includes two or more attachment portions, and
the fixation portion of the shim is common between the two attachment portions.

12. The force-sense presenting apparatus according to claim 6, wherein
the shim includes an aperture.

* * * * *